United States Patent
Miura et al.

[11] Patent Number: 5,811,846
[45] Date of Patent: Sep. 22, 1998

[54] THIN-FILM TRANSISTOR AND DISPLAY DEVICE USING THE SAME

[75] Inventors: Yasunori Miura, Yokohama; Makoto Shibusawa, Kamakura; Atsushi Sugahara, Yokohama; Masahiro Seiki, Himeji, all of Japan

[73] Assignee: Kabushiki Kaisha Toshiba, Kawasaki, Japan

[21] Appl. No.: 674,866

[22] Filed: Jul. 3, 1996

Related U.S. Application Data

[63] Continuation of Ser. No. 360,743, Dec. 23, 1994, Pat. No. 5,563,432.

[30] Foreign Application Priority Data

Apr. 3, 1993 [JP] Japan .................................. 5-096328
Apr. 20, 1994 [JP] Japan .................................. 6-081815

[51] Int. Cl.⁶ .......................................... H01C 31/062
[52] U.S. Cl. .......................... 257/291; 257/52; 257/57; 257/294; 257/347; 257/384; 257/388; 257/401; 257/412; 257/659; 257/59
[58] Field of Search .................... 257/52, 57, 59, 257/291, 294, 347, 384, 388, 401, 412, 659

[56] References Cited

FOREIGN PATENT DOCUMENTS

| | | |
|---|---|---|
| 0 574 186 | 12/1993 | European Pat. Off. . |
| 0574186 | 12/1993 | European Pat. Off. . |
| 56-107287 | 8/1981 | Japan . |
| 60-189265 | 9/1985 | Japan . |
| 61-145869 | 7/1986 | Japan . |
| 62-120076 | 6/1987 | Japan . |
| 62-171160 | 7/1987 | Japan . |
| 62-226688 | 10/1987 | Japan . |
| 2-42763 | 2/1990 | Japan . |
| 5-275698 | 10/1993 | Japan . |

OTHER PUBLICATIONS

Patent Abstracts of Japan, vol. 16, No. 316 (E–1231) Jul. 10, 1992 & JP–A–04 088 641 (Toshiba Corp), Mar. 23, 1992.
Patent Abstracts of Japan, vol. 13, No. 268 (E–775) Jun. 20, 1989 & JP–A–01 059 863 (Matsushita Electric Ind Co Ltd) Mar. 7, 1989.
Akiyama et al. "An a–Si TFT With a New Light–Shield Structure And Its Application to Active–Matrix Liquid Crystal Displays", International Electron Devices Meeting 1988, San Francisco, CA, Dec. 11–14, 1988, pp. 268–271.

*Primary Examiner*—Edward Wojciechowicz
*Attorney, Agent, or Firm*—Cushman Darby & Cushman IP Group of Pillsbury Madison & Sutro LLP

[57] ABSTRACT

In a thin-film transistor 171, in order to sufficiently suppress an optical leakage current Ioff, thereby achieving a high ON/OFF current ratio, at least one of shortest distances between an arbitrary intersection of an outline of a gate electrode 131 and an outline of a drain electrode 141 and an intersection of the outline of the gate electrode 131 and an outline of a source electrode 151 is formed to be larger than the shortest distance between a portion of the outline of the gate electrode 131 overlapping the drain electrode 141 and another portion thereof overlapping the source electrode 151.

17 Claims, 13 Drawing Sheets

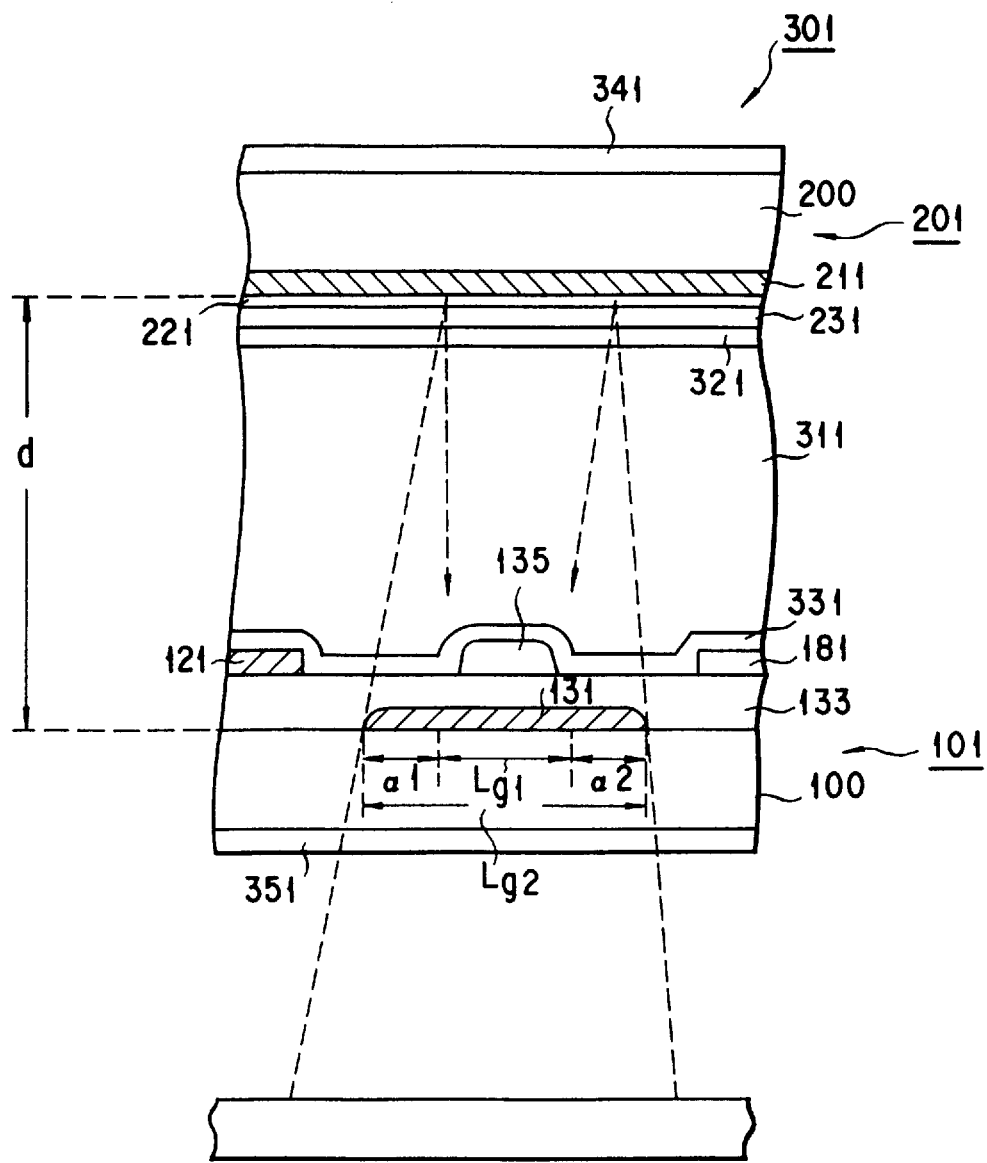
F I G. 3

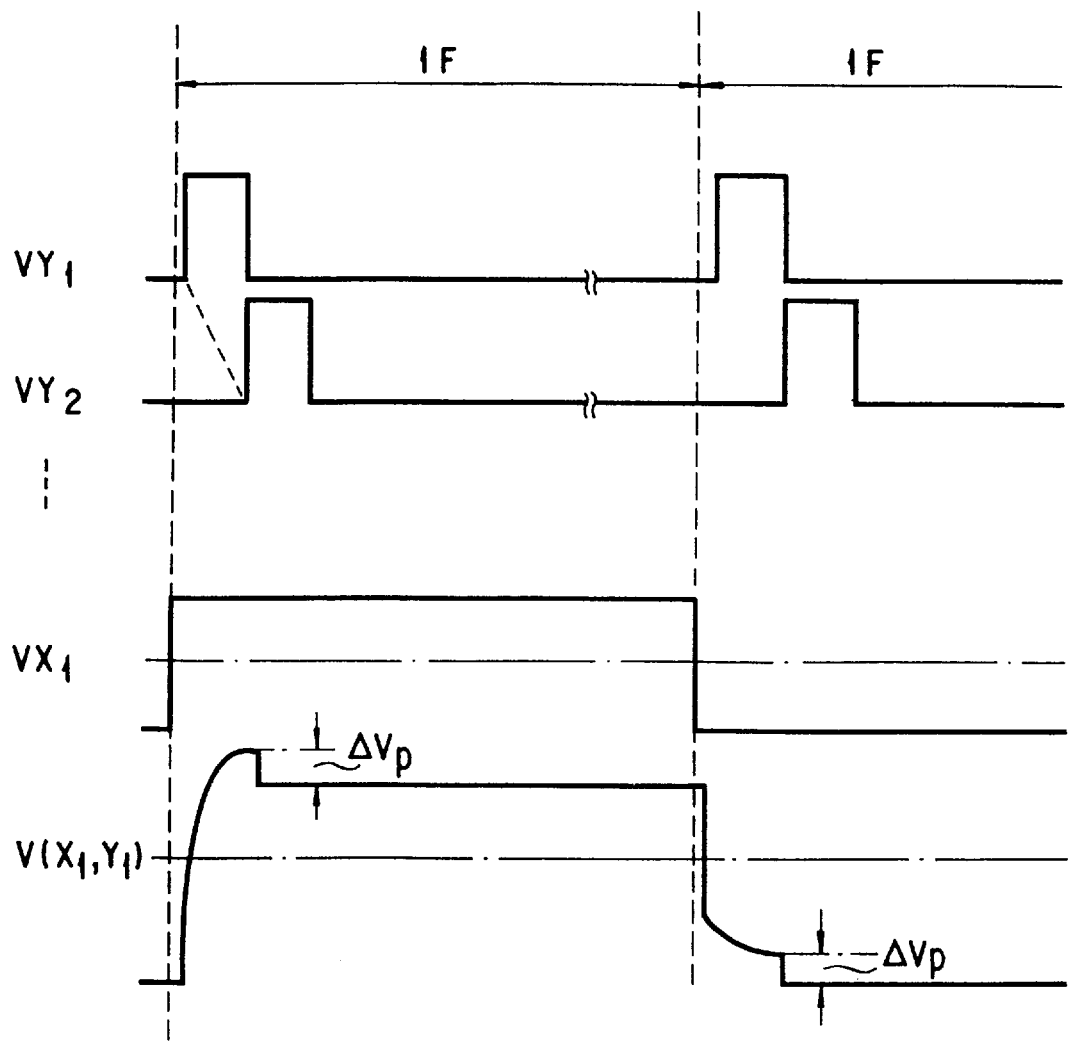
F I G. 5

THIN-FILM TRANSISTOR AND DISPLAY DEVICE USING THE SAME

This is a continuation of application Ser. No. 08/360,743, filed Dec. 23, 1994, now U.S. Pat. No. 5,563,432.

TECHNICAL FIELD

The present invention relates to a thin-film transistor and a display device such as an active matrix type liquid crystal display device, using the same.

BACKGROUND ART

TFTS are widely used as switching elements in drive circuits of various types of devices. For example, in an active matrix type liquid crystal display device, each display pixel is selected by a TFT.

Generally, a TFT has a source electrode and a drain electrode formed to be separated from each other, a semiconductor film formed to electrically contact these electrodes, a gate insulating film formed on the semiconductor film, and a gate electrode formed on the gate insulating film. TFTs of this type can be classified into a staggered type TFT in which a semiconductor film, a gate insulating film, and a gate electrode are sequentially formed on the source and drain electrodes, and an inverted staggered type TFT in which a gate insulating film, a semiconductor film, and source and drain electrodes are sequentially formed on a gate electrode.

In recent years, an increase in ON/OFF current ratio is requested in order to render a TFT operable in a higher frequency range. To achieve an increase in the ON/OFF current ratio, the length of a channel corresponding to the semiconductor film portion between the source and drain electrodes has been decreased. When the semiconductor film of the TFT is made of a silicide semiconductor represented by amorphous silicon (a—Si:H), photocarriers are generated in the semiconductor film upon incidence of light. Although a decrease in channel length can increase an ON current Ion, it facilitates movement of the photocarriers, thereby undesirably increasing an OFF current, i.e., a photoleakage current Ioff. As a result, the ON/OFF current ratio is not improved as expected.

Especially, in an active matrix type liquid crystal display device, generation of the photoleakage current Ioff directly causes variations in potential of the pixel electrodes, leading to a degradation in visual quality of the display image.

Therefore, conventionally, countermeasures have been taken such as formation of a light-shielding layer made of a metal material, e.g., chromium (Cr), on a counter substrate which is arranged to oppose an array substrate on which a plurality of pixel electrodes are formed. However, this cannot prevent the photoleakage current Ioff which is caused by the photocarrier generated in the semiconductor layer of the TFT upon incidence of light reflected by the surface of the light-shielding layer.

According to another countermeasure, for example, a light-shielding layer adjacent to the upper or lower portion of the TFT may be provided on the array substrate. However, this countermeasure cannot essentially decrease the photoleakage current Ioff sufficiently.

SUMMARY OF THE INVENTION

The present invention has been made in view of the above situations, and has as its object to provide a TFT which can reduce the photoleakage current Ioff upon incidence of light.

It is another object of the present invention to provide a display device which does not cause defective display due to the photoleakage current Ioff of the TFT.

It is still another object of the present invention to provide a TFT in which the photoleakage current Ioff can be reduced and a parasitic capacitance Cgs generated in the gate-source path or parasitic capacitance Cgd generated in the gate-drain path of the TFT can be reduced.

It is still another object of the present invention to provide a display device which can reduce a potential drop ΔVp in pixel electrode potential at an instance during which the TFT is changed from an ON state to an OFF state due to the parasitic capacitance Cgs of the TFT and also reduce the optical leakage current Ioff, so that display defect, e.g., flicker, will not be caused.

According to the present invention, there is provided a thin-film transistor comprising a gate electrode arranged on an insulating substrate, and source and drain electrodes formed on the gate electrode through at least a gate insulating film and a semiconductor film, characterized in that at least one of shortest distances between an arbitrary intersection of an outline of the gate electrode and an outline of the drain electrode and an intersection of the outline of the gate electrode and an outline of the source electrode is larger than a shortest distance between a portion of the outline of the gate electrode overlapping the drain electrode and another portion thereof overlapping the source electrode.

According to the present invention, there is also provided a thin-film transistor comprising a gate .electrode arranged on an insulating substrate, and source and drain electrodes formed on the gate electrode through at least a gate insulating film and a semiconductor film, the thin-film transistor forming a predetermined channel length, characterized in that the gate electrode comprises a gate region having a gate length larger than the channel length in a direction substantially parallel to the channel length, and at least either one selected from a drain-side extension region extending from the gate region in a direction substantially parallel to the gate length and partly overlapping the drain electrode, and a source-side extension region extending from the gate region in the direction substantially parallel to the gate length and partly overlapping the source electrode.

According to the present invention, there is also provided a display device comprising a first electrode substrate, having scanning and signal lines arranged on a first insulating substrate, and a pixel electrode connected to the scanning line and the signal line through a thin-film transistor, a second electrode substrate having a counter electrode on a second insulating substrate, and an optical modulating layer held between the first and second electrode substrates, characterized in that the thin-film transistor comprises a semiconductor film arranged through a gate insulating film on a gate electrode electrically connected to the scanning line, a drain electrode for electrically connecting the semiconductor film and the signal line, and a source electrode for electrically connecting the semiconductor film and the pixel electrode, and at least one of shortest distances between an arbitrary intersection of an outline of the gate electrode and an outline of the drain electrode and an intersection of the outline of the gate electrode and an outline of the source electrode is larger than a shortest distance between a portion of the outline of the gate electrode overlapping the drain electrode and another portion thereof overlapping the source electrode.

According to the present invention, there is also provided a thin-film transistor comprising a gate electrode arranged on an insulating substrate, a semiconductor film arranged on the gate electrode through a gate insulating film, a channel protection film arranged on the semiconductor film to determine a channel length, and source and drain electrodes electrically connected to the semiconductor film, characterized in that the channel protection film is substantially equal to or less than an outline of the gate electrode in a region thereof stacked on the semiconductor film, and at least one of shortest distances between an arbitrary intersection of an outline of the channel protection film and an outline of the drain electrode and an intersection of the outline of the channel protection film and an outline of the source electrode is-larger than a shortest distance between a portion of the outline of the channel protection film overlapping the drain electrode and another portion thereof overlapping the source electrode.

According to the present invention, there is also provided a thin-film transistor comprising a gate electrode arranged on an insulating substrate, a semiconductor film arranged on the gate electrode through a gate insulating film, a channel protection film arranged on the semiconductor film, and source and drain electrodes electrically connected to the semiconductor film, characterized in that the channel protection film comprises a channel length determining region that determines a channel length, and at least one selected from a drain-side extension region extending from the channel length determining region in a direction substantially parallel to the channel length and having a first notched portion, which is smaller than the drain electrode, in a region thereof overlapping the drain electrode, and a source-side extension region extending from channel length determining region in the direction substantially parallel to the channel length and having a second notched portion, which is smaller than the source electrode, in a region thereof overlapping the source electrode, and the gate electrode has a notched portion along the first or second notched portion.

According to the present invention, there is also provided a display device comprising a first electrode substrate, having scanning and signal lines arranged on a first insulating substrate, and a pixel electrode connected to the scanning line and the signal line through a thin-film transistor, a second electrode substrate having a counter electrode on a second insulating substrate, and an optical modulating layer held between the first and second electrode substrates, characterized in that the thin-film transistor comprises a semiconductor film arranged through a gate insulating film on a gate electrode connected to the scanning line, a channel protection film arranged on the semiconductor film to determine a channel length, a drain electrode for electrically connecting the semiconductor film and the signal line, and a source electrode for electrically connecting the semiconductor film and the pixel electrode, the channel protection film is substantially equal to or less than an outline of the gate electrode in a region thereof stacked on the semiconductor film, and at least one of shortest distances between an arbitrary intersection of an outline of the channel protection film and an outline of the drain electrode and an intersection of the outline of the channel protection film and an outline of the source electrode is larger than a shortest distance between a portion of the outline of the channel protection film overlapping the drain electrode and another portion thereof overlapping the source electrode.

According to the TFT of the present invention, at least one of shortest distances between an arbitrary intersection of an outline of the gate electrode and an outline of the drain electrode and an intersection of the outline of the gate electrode and an outline of the source electrode is formed to be larger than a shortest distance between a portion of the outline of the gate electrode overlapping the drain electrode and another portion thereof overlapping the source electrode. Alternatively, the gate region comprises a gate region having a gate length larger than the channel length in a direction substantially parallel to the channel length, and at least one selected from a drain-side extension region extending from the gate region in a direction substantially parallel to the gate length and partly overlapping the drain electrode, and a source-side extension region extending from the gate region in the direction substantially parallel to the gate length and partly overlapping the source electrode.

Hence, the gate electrode itself has a larger light-shielding effect than a conventional gate electrode, so that the photo-leakage current Ioff of the TFT is reduced, thereby obtaining an excellent ON/OFF current ratio. According to this arrangement, the gate-source path parasitic capacitance Cgs or gate-drain path parasitic capacitance Cgd of the TFT is not effectively increased.

Therefore, according to the active matrix type liquid crystal display device using this TFT, an excellent ON/OFF current ratio of the TFT can be obtained. As the integration density of the active matrix type liquid crystal display device is improved, the selection period of each pixel electrode is shortened. Even in such a display device, a video signal can be sufficiently written in the pixel electrode.

Furthermore, since the gate-source path parasitic capacitance Cgs or gate-drain path parasitic capacitance Cgd of the TFT is not increased, variations in potential of the pixel electrode or an increase in time constant of wirings is not caused.

The TFT of the present invention has a channel protection film which is substantially equal to or less than the outline of the gate electrode in a region thereof stacked on the semiconductor film. At least one of shortest distances between an arbitrary intersection of an outline of the channel protection film and an outline of the drain electrode and an intersection of the outline of the channel protection film and an outline of the source electrode is formed to be larger than a shortest distance between a portion of the outline of the channel protection film overlapping the drain electrode and another portion thereof overlapping the source electrode. In the TFT of the present invention, the channel protection film comprises a channel length determining region that determines a channel length, and a drain-side extension region extending from the channel length determining region in a direction substantially parallel to the channel length and having a notched portion, which is smaller than the drain electrode, in a region thereof overlapping the drain electrode, or a source-side extension region extending from channel length determining region in the direction substantially parallel to the channel length and having a notched portion, which is smaller than the source electrode, in a region thereof overlapping the source electrode. The gate electrode has a notched portion along this notched portion.

Thus, the path Psc of the side-channel region which influences the photoleakage current Ioff is set large, so that the photoleakage current Ioff is reduced, thereby obtaining a TFT having a high ON/OFF current ratio.

According to the active matrix type liquid crystal display device using this TFT, an excellent ON/OFF current ratio of the TFT can be obtained. As the integration density of the active matrix type liquid crystal display device is improved, the selection period of each pixel electrode is shortened. Even in such a display device, a video signal can be sufficiently written in the pixel electrode.

BRIEF DESCRIPTION OF DRAWINGS

FIG. 3 is a sectional view schematically showing a sectional structure taken along the line 3—3' of FIG. 1;

FIG. 4(b) is a plan view schematically showing the structure of that gate electrode of the TFT;

FIG. 5 is a waveform chart of signals that drive the active matrix type liquid crystal display device shown in FIG. 1;

FIG. 8(a) is a plan view schematically showing the structure of a part of this active matrix type liquid crystal display device, and FIG. 8(b) is a sectional view schematically showing a sectional structure taken along the line 8(b)—8(b)' of FIG. 8(a);

FIG. 9(a) is a plan view schematically showing the structure of the TFT, FIG. 9(b) is a sectional view schematically showing a sectional structure taken along the line 9(b)—9(b)' of FIG. 9(a), FIG. 9(c) is a sectional view schematically showing a sectional structure taken along the line 9(c)—9(c)' of FIG. 9(a), FIG. 9(d) is a plan view schematically showing the structure of the gate electrode of the TFT, and FIG. 9(e) is a plan view schematically showing the structure of a channel protection film;

FIG. 10(a) is a plan view schematically showing the structure of a general TFT, and FIG. 10(b) is a sectional view schematically showing a sectional structure taken along the line 10(b)—10(b)' of FIG. 10(a);

FIG. 13(a) is a plan view schematically showing the structure of a scanning line, and FIG. 13(b) is a plan view schematically showing the structure of a channel protection film.

DETAILED DESCRIPTION OF THE PREFERRED EMBODIMENT

A light-transmission active matrix type liquid crystal display device according to the first embodiment of the present invention will be described with reference to the accompanying drawings.

Figure 1:
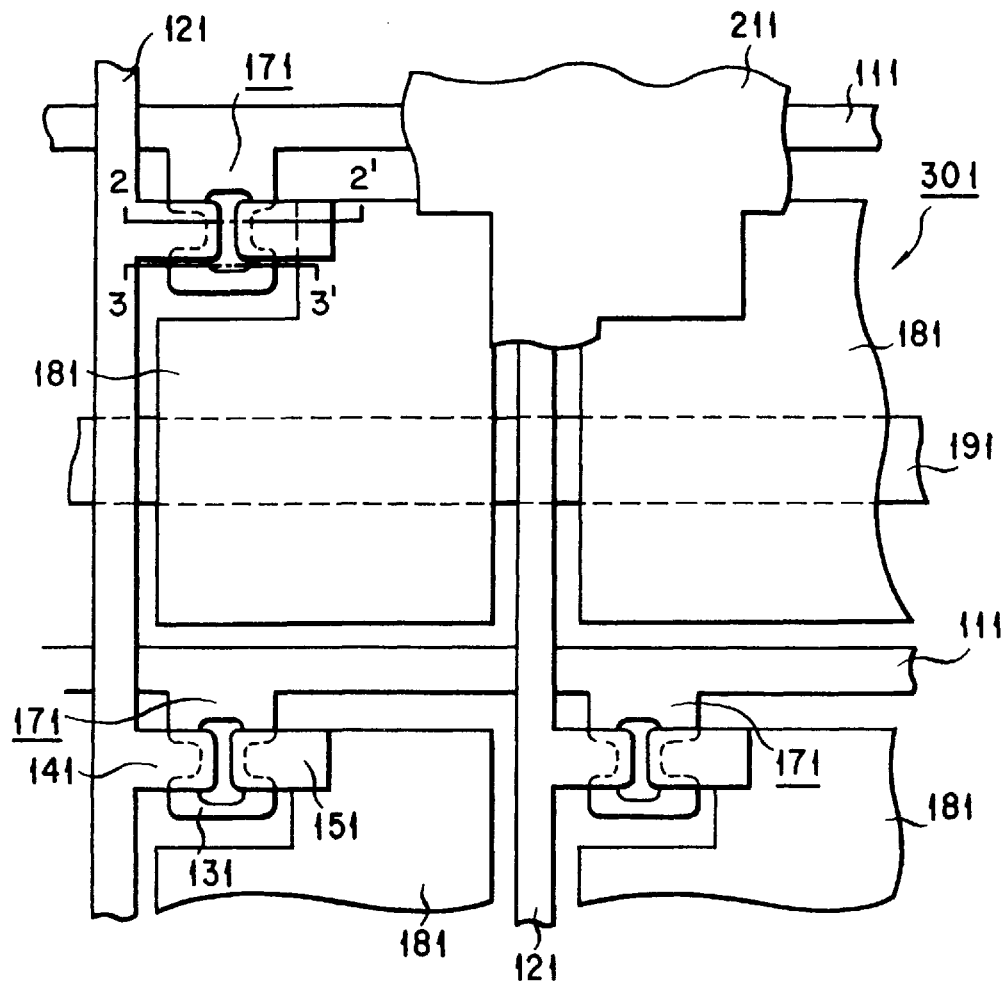
FIG. 1 is a plan view schematically showing the structure of a part of an active matrix type liquid crystal display device according to the first embodiment of the present invention.
Figure 2:
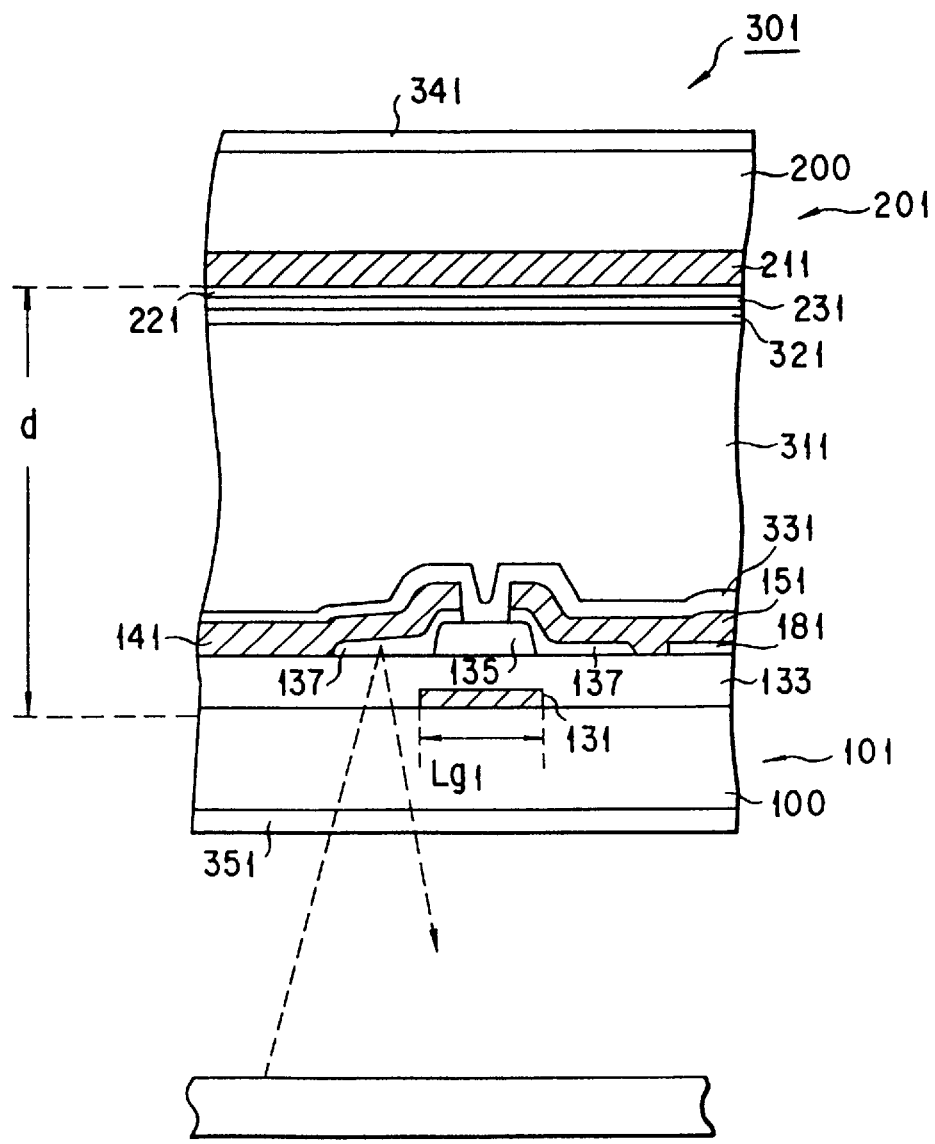
FIG. 2 is a sectional view schematically showing a sectional structure taken along the line 2—2' of FIG. 1.

FIG. 1 shows a schematic planar structure concerning a part of an active matrix type liquid crystal display device 301, FIG. 2 shows a schematic sectional structure along the line 2—2' of FIG. 1, and FIG. 3 shows a schematic sectional structure along the line 3—3' of FIG. 1.

The liquid crystal display device 301 shown in FIGS. 1 to 3 has an array substrate 101, a counter substrate 201, and a liquid crystal layer 311 made of a nematic liquid crystal compound. A matrix array of a plurality of pixel electrodes 181 and a plurality of TFTs 171 connected to these pixel electrodes are formed on a glass substrate 100, thereby forming the array substrate 101. A counter electrode 231 made of ITO (Indium Tin Oxide) is formed on a glass substrate 200, thereby forming the counter substrate 201. The array substrate 101 and the counter substrate 201 oppose each other at a gap of 5 microns such that alignment films 321 and 331 respectively formed on their surfaces are on the inner sides. The liquid crystal layer 311 is held between the array substrate 101 and the counter substrate 201.

As shown in FIG. 1, the array substrate 101 has $\underline{n}$ scanning lines 111 (Yj: j=1, 2, . . . , n) and $\underline{m}$ signal lines 121 (Xi: i=1, 2, . . . , m) formed on the glass substrate 100 along the rows and columns and rows of the pixel electrodes 181, respectively. The TFTs 171 are arranged in the vicinities of the intersections of the scanning lines 111 and the signal lines 121. Gate electrodes 131 are formed integrally with the scanning lines 111. Drain electrodes 141 are formed integrally with the signal lines 121. Source electrodes 151 are formed in contact with the pixel electrodes 181.

The array substrate 101 has storage capacitor storage lines 191 made of the same material as that of the scanning lines 111 and arranged to be substantially parallel with the scanning lines 111. The storage capacitor lines 191 are formed on the pixel electrodes 181 through a multilayered gate insulating film 133 shown in FIG. 2 which is formed by stacking a silicon oxide ($SiO_2$) film and a silicon nitride ($SiN_x$) film. Thus, storage capacitors Cs are formed between the storage capacitor lines 191 and the pixel electrodes 181.

As shown in FIGS. 2 and 3, the counter substrate 201 has a grid-like light-shielding layer 211 formed on the glass substrate 200. The counter electrode 231 is formed on the light-shielding layer 211 through an insulating film 221. The light-shielding layer 211 is made of chromium (Cr) and shields light leaking from portions around the plurality of pixel electrodes 181 formed on the array substrate 201 side, i.e., from regions where the TFTs 171, the signal lines 121, and the scanning lines 111 are formed. The surface of the light-shielding layer 211 may be oxidized to decrease light reflection. The light-shielding layer 211 may be made of, e.g., a black resin that provides a sufficient light-shielding effect. A color filter layer may be provided between the light-shielding layer 211 and the counter electrode 231 to realize color display.

The active matrix type liquid crystal display device 301 further has polarizing plates 351 and 341 formed on the surfaces of the glass substrates 100 and 200 on sides opposite to the liquid crystal layer 311. The orientations of the polarizing plates 351 and 341 are set such that their axes of polarization are perpendicular to each other.

Referring to FIGS. 2 and 3, in the conventional active matrix type liquid crystal display device, although most of oblique light incident on the counter substrate 201 and directed to the TFT 171 is shielded by the light-shielding layer 211, oblique light incident on the array substrate 101, reflected by the light-shielding layer 211, and directed to the TFT 171 cannot be shielded.

In this embodiment, however, the active matrix type liquid crystal display device 301 is designed to sufficiently reduce oblique light reflected by the light-shielding layer 211 and directed to the TFT 171. Therefore, the photoleakage current Ioff of the TFT 171 can be suppressed, thereby achieving a high ON/OFF current ratio.

Figure 4A:
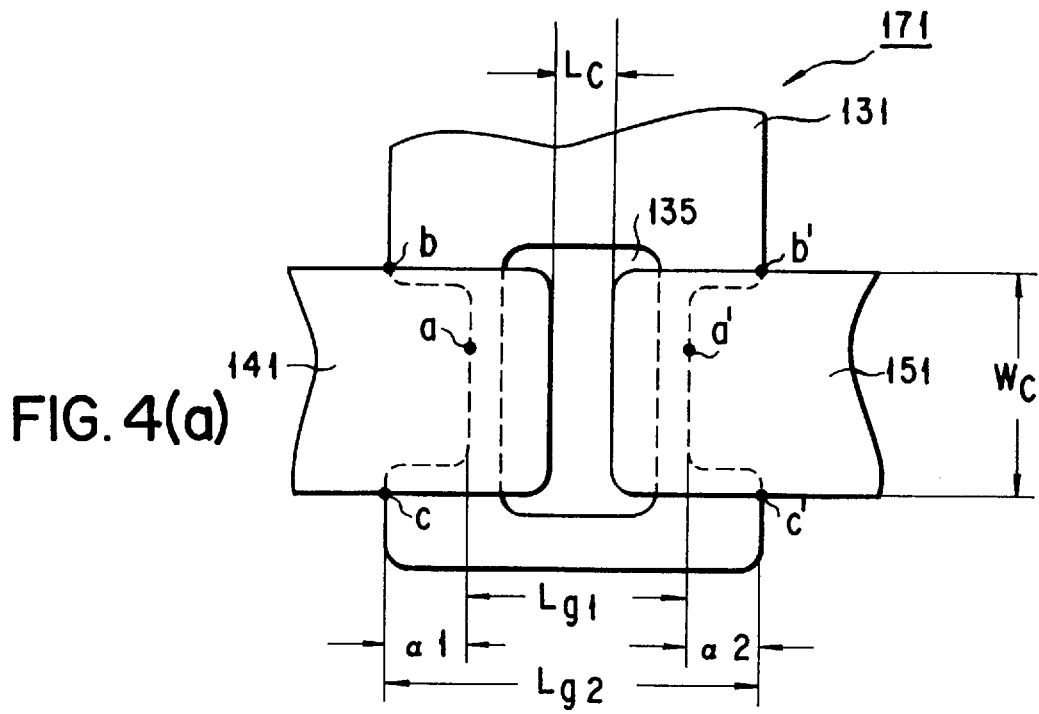
FIGS. 4(a) and 4(b) explain a TFT provided to the active matrix type liquid crystal display device shown FIG. 1, in FIG. 4(a) is a plan view schematically showing the structure of the TFT.
Figure 4B:
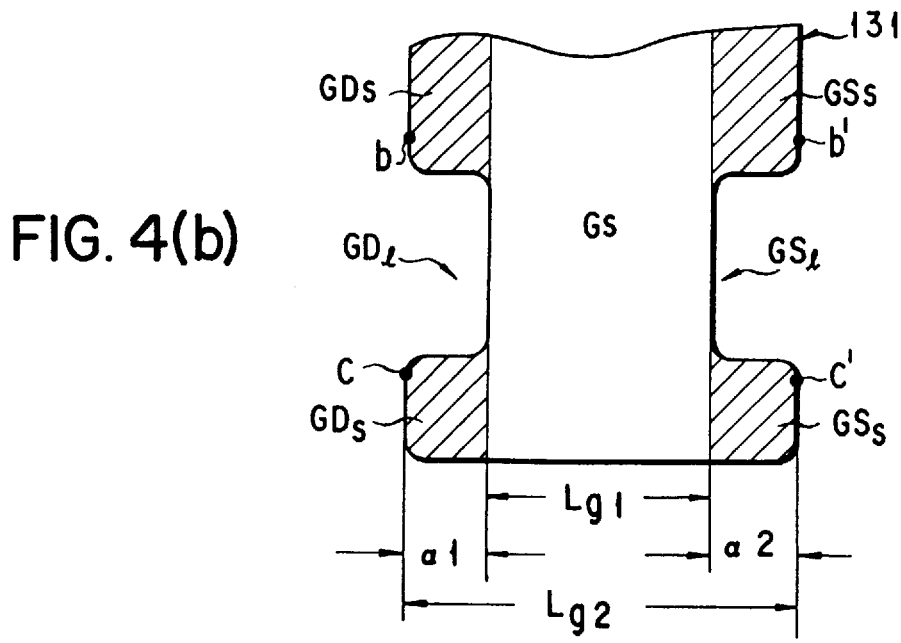

More specifically, each TFT 171 has a gate electrode 131 formed to have a shape as shown in FIG. 4(b). The gate electrode 131 is made of an Mo—Ta alloy and includes a gate region Gs having a gate width Lg1 of 14 microns. Other than the Mo—Ta alloy, e.g., an Mo—W alloy, an Mo—Ta alloy, or a multilayered film of the Mo—W alloy and aluminum (Al) can be used as the material of the gate electrode 131. As shown in FIG. 2, the TFT 171 further has a multilayered gate insulating film 133, a semiconductor film 135, a drain electrode 141, and a source electrode 151. The multilayered gate insulating film 133 is constituted by a silicon oxide ($SiO_2$) film formed on the gate electrode 131 to a thickness of 3,500 Å and a silicon nitride ($SiN_x$) film formed on the silicon oxide ($SiO_2$) film to a thickness of 500 Å. The semiconductor film 135 is constituted by an amorphous silicon (a—Si:H) film formed on part of the gate insulating film 133 to a thickness of 3,000 Å. The drain electrode 141 and the source electrode 151 have a multilayered structure of molybdenum (Mo) and aluminum (Al) and are formed to be apart from each other. The drain electrode 141 and the source electrode 151 are formed on the semiconductor film 135 respectively through low-resistance semiconductor thin films 137 to be electrically connected to the semiconductor film 135. Each low-resistance semiconductor thin film 137 is constituted by an $n^+$-type amorphous silicon ($n^+$a—Si:H) film having a thickness of 500 Å, and used to obtain good ohmic contact between the drain and source electrodes 141 and 151 and the semiconductor film 135.

A channel length Lc of the TFT 171 is determined by the gap between the drain electrode 141 and the source electrode 151, as shown in FIG. 4(a), and is set to 4 microns in this embodiment. A channel width Wc of the TFT 171 is set to 23 microns.

In this embodiment, the shortest distance between an arbitrary intersection of the outline of the gate electrode 131 and the outline of the drain electrode 141 and an intersection of the outline of the gate electrode 131 and the outline of the source electrode 151, i.e., distances between points b—b' and c—c' in FIGS. 4(a) and 4(b) are set larger than the shortest distance between a portion of the outline of the gate electrode 131 overlapping the drain electrode 141 and a portion of the same overlapping the source electrode 151, i.e., than a distance between points a—a'.

As shown in FIGS. 4(a) and 4(b), this setting can be achieved when the gate electrode 131 has a gate region Gs having a gate width Lg1 larger than the channel length Lc, a drain-side extension region GDs extending from the gate region Gs in a direction of the gate width Lg1 for an extending length α1 of 6 microns and overlapping the drain electrode 141, and a source-side extension region GSs extending from the gate region Gs in the direction of the gate width Lg1 for an extending length α2 of 6 microns and overlapping the source electrode 151; and the source-side extension region GSs and the drain-side extension region GDs have, at portions thereof respectively overlapping the source electrode 151 and the drain electrode 141, gate electrode notched portions GS1 and GD1 smaller than the overlapping portions.

Hence, only an effective gate width Lg2 of the gate electrode 131 is extended for the extending lengths α1 and α2 of the drain-side extension region GDs and the source-side extension region GSs without changing the channel length Lc.

In this embodiment, as shown in FIG. 3, the drain-side extension region GDs (corresponding to area α1) and the source-side extension region GSs (corresponding to area α2) shield undesired oblique light reflected by the surface of the light-shielding layer 211 and directed to the semiconductor film 135. As a result, the TFT 171 of this embodiment can shield undesired oblique light more than the conventional TFT having no drain- and source-side extension regions GDs and GSs does by an increase of 80%.

In this embodiment, since the drain- and source-side extension regions GDs and GSs are parts of the gate electrode 131, they can be formed in the steps of forming the gate electrode 131. If a light-shielding film is to be formed under or above the TFT 171 through an insulating film to obtain a light-shielding function similar to that of the regions GDs and GSs, the location of the light-shielding film is displaced from the TFT 171 within a predetermined allowance because such a light-shielding film is formed in accordance with forming steps independently of the steps of forming the gate electrode 131. If the size of the light-shielding film is set larger by a margin for absorbing the displacement, it decreases the degree of opening of the display device. In this embodiment, however, since the positional displacement of the light-shielding film need not be considered, a high degree of opening of the display device can be obtained. Furthermore, in this embodiment, since an undesired influence to the capacitance or potential can be neglected, unlike in a case wherein the above-mentioned insulating film is formed under or above the TFT 171 through the insulating film, no trouble occurs in the display operation.

As is understood from FIGS. 2 and 3, when the effective gate width Lg2 including the respective extension regions GDs and GSs is increased more, undesired oblique light can be shielded. However, since this lowers the degree of opening of the display device 301, an increase in effective gate width Lg2 including the respective extension regions GDs and GSS is limited.

According to the experiment conducted by the present inventors, it has become obvious that an effect of shielding undesired oblique light can be obtained if the effective gate width Lg2 is 20 microns or more, and preferably, 26 microns or more. For this reason, in this embodiment, the effective gate width Lg2 is set to 26 microns considering the degree of opening. Assuming the distance between the surface of the glass substrate 100 on which the gate electrode 131 is formed and the surface of the light-shielding layer 211 is defined as d microns, the effective gate width Lg2 including the extension regions GSs and GDs may be formed to 3d or more, and preferably, 4d or more. When, e.g., the light-shielding layer 211 is formed on the array substrate 201 side, a layer of the counter substrate 201 side which has the highest light reflectance may be used as the reference.

A more characteristic feature is that both the source- and drain-side extension regions GSs and GDs of the gate electrode 131 have, at portions thereof respectively overlapping the source and drain electrodes 151 and 141, the gate electrode notched portions GS1 and GD1 smaller than the overlapping portions. As a result, even when the effective gate width Lg2 including the respective extension regions GSs and GDs is increased, an increase in gate-source path parasitic capacitance Cgs inevitably formed in the TFT 171 is prevented, thereby suppressing variations in potential of the pixel electrode 181.

FIG. 5 shows the waveforms of signals that derive this active matrix type liquid crystal display device 301. Gate pulses (VYj: j=1, 2, . . . , n) are sequentially supplied to the scanning lines 111 (Yj), and a TFT 171 connected to a scanning line 111 (Yj) to which a gate pulse (VYj) is input is set ON for a predetermined period of time. Video signals (VXi: i=1, 2, . . . , m) are supplied to the signal lines 121 (Xi).

Thus, a TFT 171 connected to a scanning line 111 (Yj) and a signal line 121 (Xi) is turned on, and a video signal (VXi) is written in a pixel electrode 181 (Xi,Yj) during the ON period of this TFT 171. The potential V(Xi,Yj) of the pixel electrode 181 (Xi,Yj) is held for, e.g., 1 field period (1 F).

As is apparent from FIG. 5, when the TFTs 171 have n channels, as the gate pulse (VYj) falls, each pixel electrode potential V(Xi,Yj) is decreased to the negative side by ΔVp. The potential drop ΔVp largely depends on the gate-source path parasitic capacitance cgs between the scanning line 111 (Yj), the gate electrode 131, the pixel electrode 181, and the source electrode 141, as indicated by the following equation (Clc: liquid crystal capacitance, Cs: storage capacitor):

$$\Delta Vp = \Delta VXi \times Cgs/(Clc + Cs + Cgs)$$

According to this embodiment, however, since the gate-source path parasitic capacitance Cgs between the gate electrode 131 and the source electrode 151 does not substantially change when compared to the conventional case, flicker does not occur due to the potential drop ΔVp.

As described above, according to the active matrix type liquid crystal display device 301 of this embodiment, since the effective gate width Lg2 of the gate electrode 131 that functions as an incidence blocking layer against oblique light is increased without changing the channel length Lc of the TFT 171, the photoleakage current Ioff can be greatly decreased while maintaining a high ON current Ion in the same manner as in the conventional case, so that a high ON/OFF current ratio can be achieved. According to this embodiment, when compared to a conventional TFT not having source- and drain-side extension regions GSs and GDs of the gate electrode 131 and having similar channel length Lc and channel width Wc, the ON/OFF current ratio of the TFT 171 can be increased to about twice.

According to this embodiment, in spite that the effective gate width Lg2 of the gate electrode 131 is increased, since the gate-source path parasitic capacitance Cgs of the TFT 171 is suppressed, the voltage drop ΔVp of the pixel electrode 181 is not increased.

Also, since the effective gate width Lg2 is increased, the time constants of the scanning lines 111 (Yj) and the gate electrodes 131 can be made smaller than those of the conventional case. In a large active matrix type liquid crystal display device having a large wiring length, this solves a decrease in effective gate pulse width caused by a delay in gate pulse (VYj) and enables the write operation of the video signal (VXi) for a longer period of time.

Figure 6:
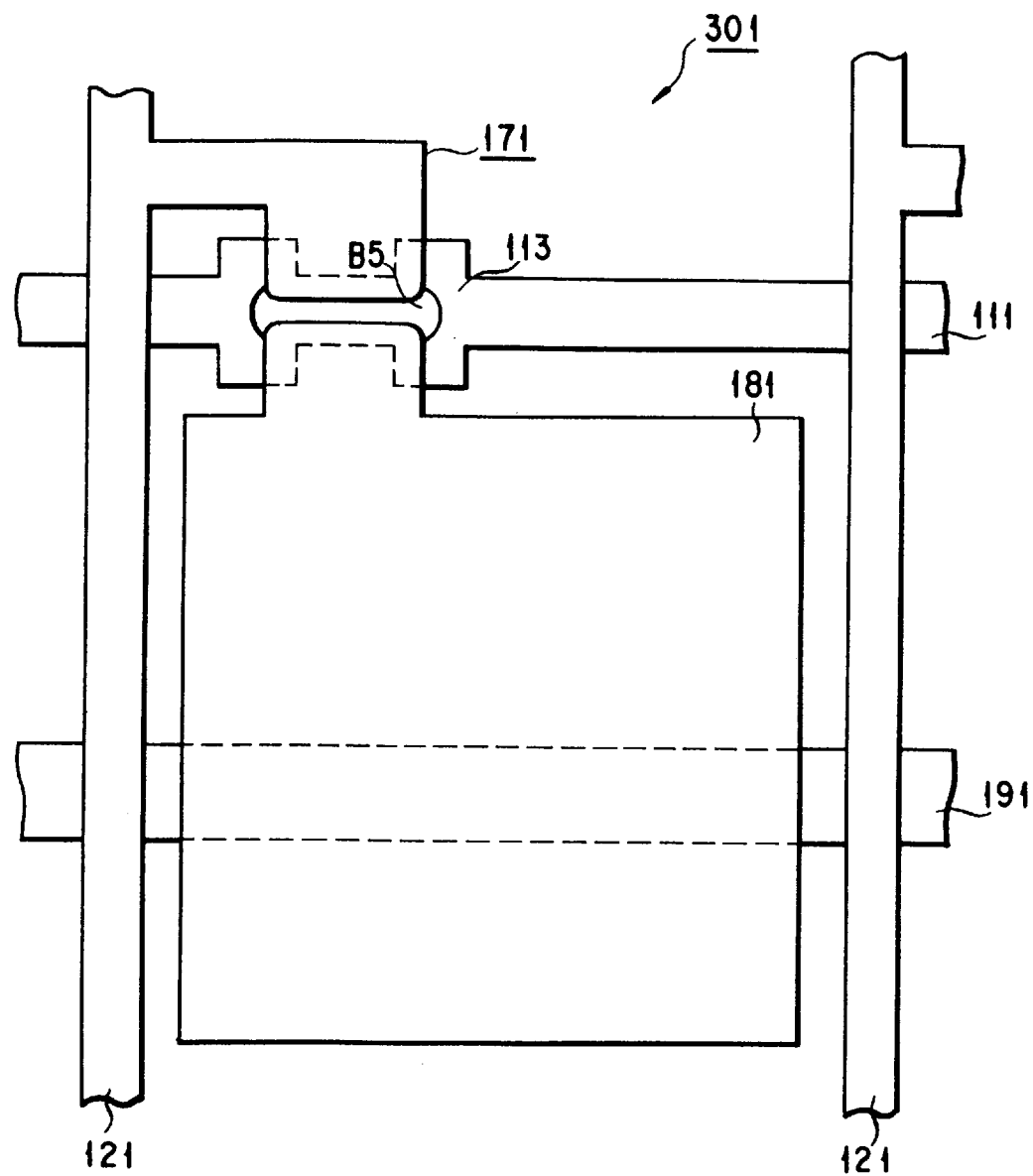
FIG. 6 is a plan view schematically showing the structure of a modification of the active matrix type liquid crystal display device shown in FIG. 1.

In the active matrix type liquid crystal display device 301 of this embodiment, in order to set the channels of the TFTs 171 and the scanning lines 111 (YJ) to be parallel to each other, all the gate electrodes 131 are constituted by portions extending from the trunks of the scanning lines 111 (Yj). However, this arrangement of the TFTs 171 can be changed such that the channels of the TFTs 171 and the scanning lines 111 (Yj) are perpendicular to each other, as shown in FIG. 6. In this case, a gate region Gs of each gate electrode 131 is constituted by the trunk of a corresponding scanning line 111 (Yj), and a source-side extension region GSs and a drain-side extension region GDs are constituted by portions extending from the trunk of this scanning line 111 (Yj). In FIG. 6, portions similar to those in the above embodiment are denoted by the same reference numerals.

The structure shown in FIG. 6 can increase the degree of opening of the display device 301 by 5 points as compared to the embodiment having the above structure if a pixel pitch is set to, e.g., 250×90 $\mu m^2$. In this specification, a "point" is used as a difference in the degree of opening (%).

Figure 7:
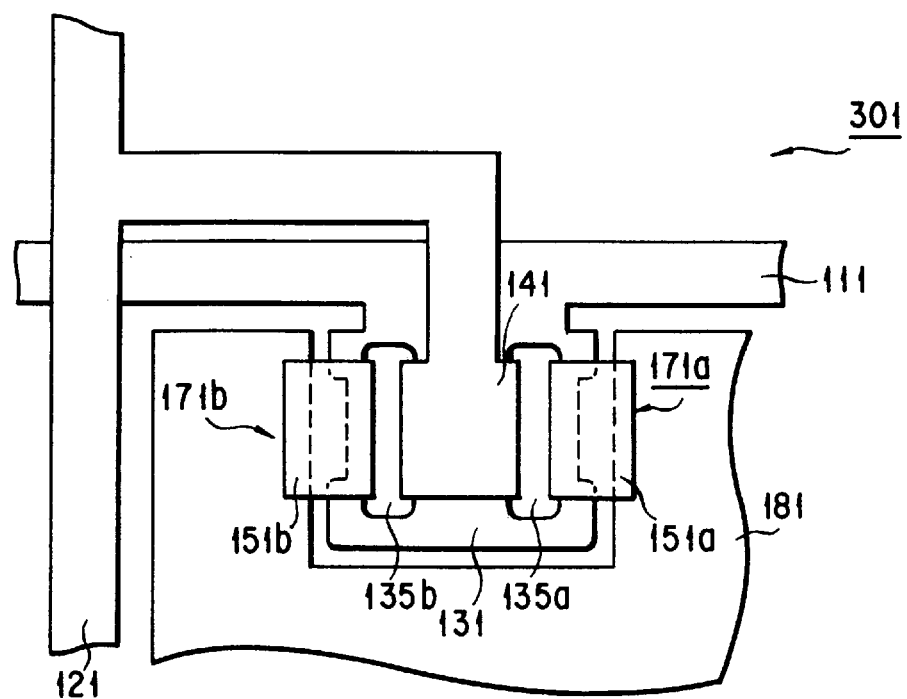
FIG. 7 is a plan view schematically showing the main part of another modification of the active matrix type liquid crystal display device shown in FIG. 1.

In the above embodiment, each pixel electrode 181 is connected to one corresponding TFT 171. For example, however, as shown in FIG. 7, each pixel electrode 181 may be connected to two TFTs 171a and 171b that are formed to be electrically parallel to each other. In the structure shown in FIG. 7, a difference in channel length Lc, which is formed between the TFTs 171a and 171b when, e.g., the pattern of source electrodes 151a and 151b and a drain electrode 141 is displaced in the direction of a scanning line 111, can be canceled. As a result, the variations in manufacturing conditions can be compensated for.

An active matrix type liquid crystal display device 601 according to the second embodiment of the present invention will be described with reference to the accompanying drawings.

Figure 8A:
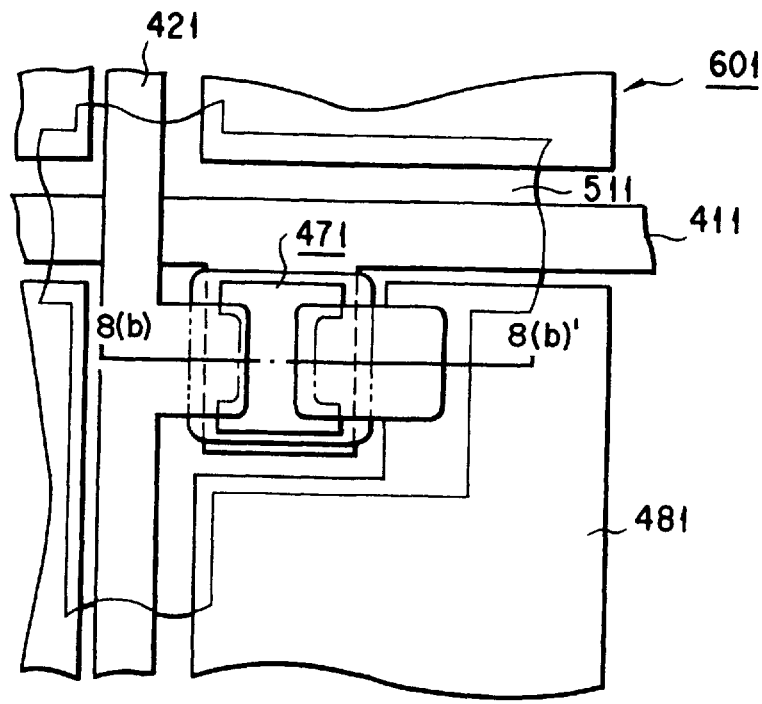
FIGS. 8(a) and 8(b) explain an active matrix type liquid crystal display device according to the second embodiment of the present invention.
Figure 8B:
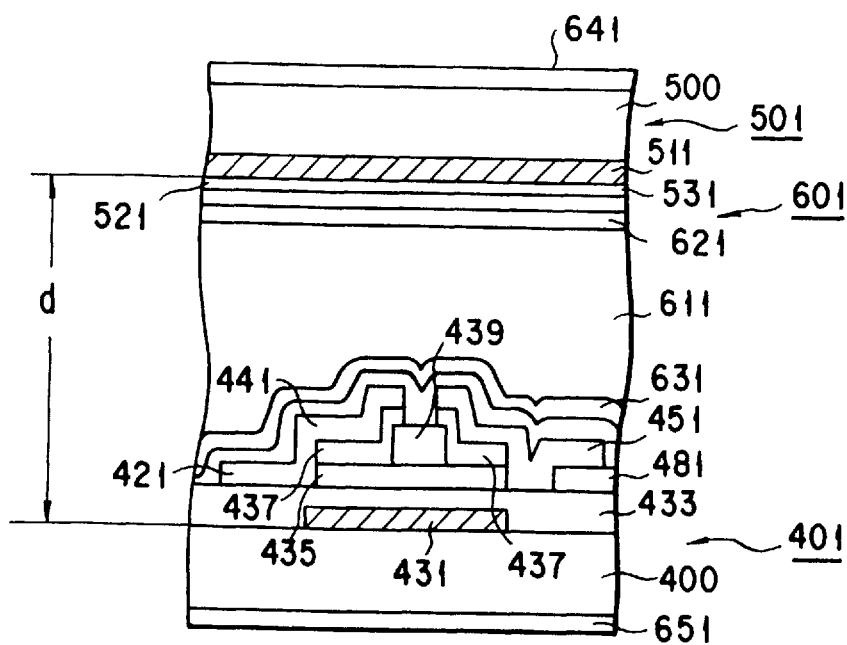
Figure 9A:
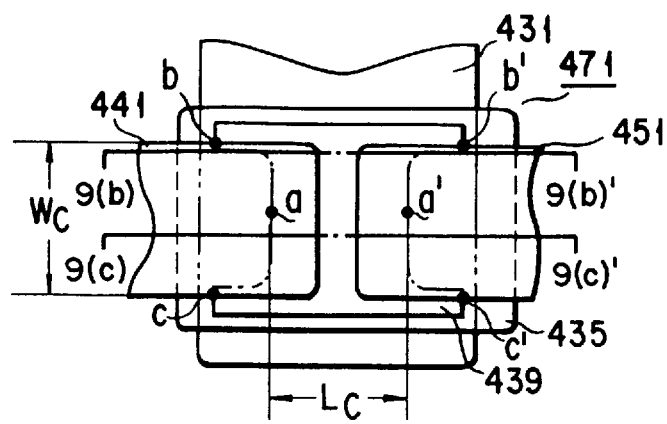
FIGS. 9(a)–9(e) explain a TFT provided to the active matrix type liquid crystal display device shown in FIGS. 8(a)–8(b)
Figure 9B:
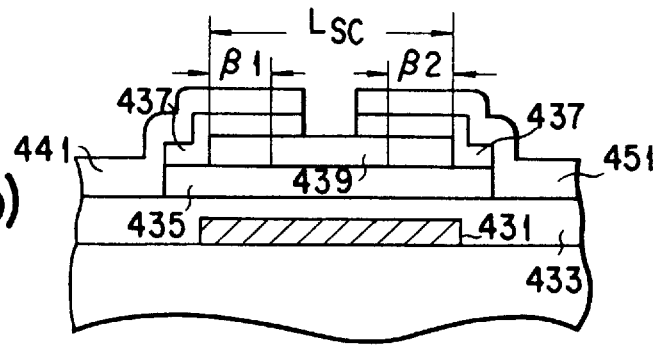
Figure 9C:
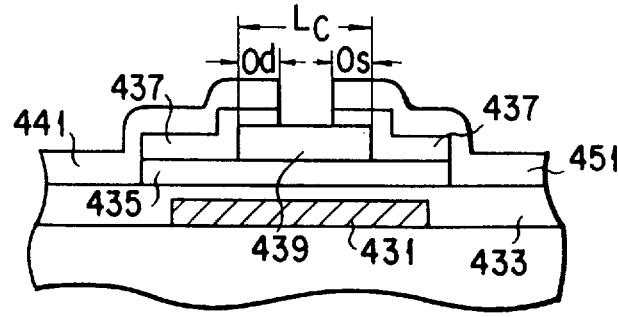
Figure 9D:
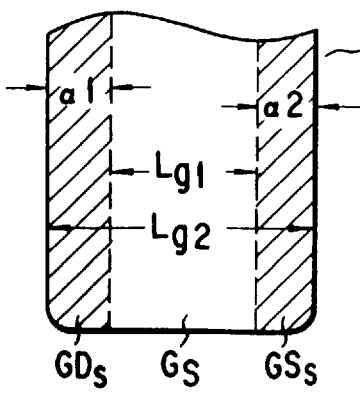
Figure 9E:
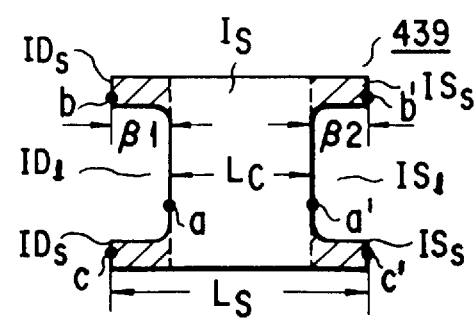

FIG. 8(a) shows a schematic planar structure concerning part of this active matrix type liquid crystal display device 601, and FIG. 8(b) shows a schematic sectional structure along the line 8(b)—8(b)' of FIG. 8(a). FIG. 9(a) shows the planar structure of a TFT 471 shown in FIGS. 8(a) and 8(b), FIG. 9(b) shows the sectional structure of the TFT 471 along the line 9(b)—9(b)' of FIG. 9(a), FIG. 9(c) shows the sectional structure of the TFT 471 along the line 9(c0—9(c)' of FIG. 9(a), FIG. 9(d) shows the detailed planar structure of a gate electrode 431 shown in FIGS. 9(a) to 9(c), and FIG. 9(e) shows the detailed planar structure of a channel protection film 439 shown in FIGS. 9(a) to 9(c).

The liquid crystal display device 601 shown in FIGS. 8(a) and 8(b) has an array substrate 401, a counter substrate 501, and a liquid crystal layer 611. A matrix array of a plurality of pixel electrodes 481 and a plurality of TFTs 471 connected to these pixel electrodes 481 are formed on a glass substrate 400, thereby forming the array substrate 401. A counter electrode 531 made of ITO (Indium Tin Oxide) is formed on a glass substrate 500, thereby forming the counter substrate 501. The liquid crystal layer 611 is made of a nematic liquid crystal compound. The array substrate 401 and the counter substrate 501 oppose each other at a gap of 5 microns such that alignment films 631 and 621 respectively formed on their surfaces are on their inner sides. The liquid crystal layer 611 is held between the array substrate 401 and the counter substrate 501.

The array substrate 401 has n scanning lines 411 (Yj: j=1, 2, . . . , n) and m signal lines 421 (Xi: i=1, 2, . . . , m) formed on the glass substrate 400 along the rows and columns of the pixel electrodes 481, respectively. The TFTs 471 are arranged in the vicinities of the intersections of the scanning lines 411 and the signal lines 421, and have a channel length Lc of 12 microns and a channel width Wc of 23 microns. Gate electrodes 431 are formed integrally with the scanning lines 411. Drain electrodes 441 are formed integrally with the signal lines 421. Source electrodes 451 are formed in contact with the pixel electrodes 481.

The TFT 471 will be described in detail. The gate electrode 431 is made of an Mo—Ta alloy, and, as shown in FIG. 9(*d*), has a gate region Gs having a gate width Lg1 of 14 microns larger than the channel length Lc, a drain-side extension region GDs extending from the gate region Gs in a direction substantially parallel to the gate width Lg1 for an extending length α1 of 6 microns and overlapping the drain electrode 441, and a sourceside extension region GSs extending from the gate region Gs in a direction substantially parallel to the gate width Lg1 for an extending length α2 of 6 microns and overlapping the source electrode 451.

The TFT 471 further has a multilayered gate insulating film 433, a semiconductor film 435, a channel protection film 439, the drain electrode 441, and the source electrode 451. The multilayered gate insulating film 433 is constituted by a silicon oxide ($SiO_2$) film formed on the gate electrode 431 shown in FIGS. 9(*b*) and 9(*c*) to a thickness of 3,500 Å and a silicon nitride ($SiN_x$) film formed on the silicon oxide ($SiO_2$) film to a thickness of 500 Å. The semiconductor film 435 is constituted by an amorphous silicon (a—Si:H) film formed on the gate insulating film 433 to a thickness of 300 Å. The channel protection film 439 is constituted by a silicon nitride ($SiN_x$) film formed on the semiconductor film 435 to a thickness of 2,000 Å and determines the channel length Lc of the TFT 471. The drain electrode 441 and the source electrode 451 have a multilayered structure of molybdenum (Mo) and aluminum (Al) and are formed to be apart from each other. The drain electrode 441 and the source electrode 451 are formed on the channel protection film 439 and the semiconductor film 435 through low-resistance semiconductor thin films 437 to be electrically connected to the semiconductor film 435. Each low-resistance semiconductor thin film 437 is constituted by an $n^+$-type amorphous silicon ($n^+$a—Si:H) film having a thickness of 500 Å, and used to obtain good ohmic contact between the drain and source electrodes 441 and a 451 and the semiconductor film 435.

Although not shown, the array substrate 401 has storage capacitor lines made of the same material as that of the scanning lines 411. These storage capacitor lines are formed on the pixel electrodes 481 through the multilayered gate insulating film 433 obtained by stacking the silicon oxide ($SiO_2$) film and the silicon nitride ($SiN_x$) film, so that an storage capacitor Cs is formed between the storage capacitor line and the pixel electrode 481.

The counter substrate 501 has a grid-like light-shielding layer 511 formed on the glass substrate 500 shown in FIG. 8(*b*). The counter electrode 531 is formed on the light-shielding layer 511 through an insulating film 521. The light-shielding layer 511 is made of chromium (Cr) and shields light leaking from portions around the plurality of pixel electrodes 481 formed on the array substrate 401 side, i.e., from regions where the TFTs 471, signal lines 121, and the scanning lines 411 are formed.

The active matrix type liquid crystal display device 601 further has polarizing plates 651 and 641 formed on the surfaces of the glass substrates 400 and 500 on sides opposite to the liquid crystal layer 611. The orientations of the polarizing plates 651 and 641 are set such that their axes of polarization are perpendicular to each other.

As shown in FIGS. 9(*a*) and 9(*d*), in the gate electrode 431 of the TFT 471, the gate region Gs has the gate width Lg1 larger than the channel length Lc. The drain-side extension region GDs extends from the gate region Gs in a direction substantially parallel to the gate width Lg1 for an extending length α1 of 6 microns, and overlaps the drain electrode 441. The source-side extension region GSs extends from the gate region Gs in the direction substantially parallel to the gate width Lg1 for an extending length α2 of 6 microns, and overlaps the source electrode 451.

As shown in FIGS. 9(*a*) and 9(*e*), the channel protection film 439 is formed such that a region thereof stacked on the semiconductor film 435 is smaller than the outline of the gate electrode 431. Furthermore, the shortest distance between an arbitrary intersection of the outline of the channel protection film 439 and the outline of the drain electrode 441 and an intersection of the outline of the channel protection film 439 and the outline of the source electrode 451, i.e., distances between points b—b' and c—c' are set larger than the shortest distance between a portion of the outline of the channel protection film 439 overlapping the drain electrode 451 and a portion of the same overlapping the source electrode 441, i.e., than a distance between points a—a'.

This setting can be achieved when the channel protection film 439 has a channel length determination region Is determining the channel length Lc of the TFT 471, at least a drain-side extension region IDs extending from the channel length determination region Is in a direction substantially parallel to the channel length for an extending length β1 and overlapping the drain electrode 441, and a source-side extension region extending from the channel length determination region Is in the direction substantially parallel to the channel length for an extending length β2 and partly overlapping the source electrode 451; the extension regions IDs and ISs have channel protection film notched portions ID1 and IS1 are respectively smaller than the drain electrode 441 and the source electrode 451.

Hence, only an effective gate width Lg2 of the gate electrode 431 is extended for the extending lengths α1 and α2 of the extension regions GDs and GSs without changing the channel length Lc, and is set to 26 microns, in the same manner as in the first embodiment.

In the TFT 471 of the second embodiment, the source electrode 451, the drain electrode 441, and the drain- and source-side extension regions GDs and GSs of the gate electrode 431 shield back light or oblique light incident under illumination of external light and directed to the semiconductor film 435. Thus, the TFT 471 of this embodiment can shield undesired oblique light more than the conventional TFT having no drain-and source-side extension regions GDs and GSs does by an increase of 80%, in the same manner as in the first embodiment.

Since a portion of the channel protection film 439 multilayered on the semiconductor film 435 is formed smaller than the outline of the gate electrode 431, the photoleakage current Ioff is not increased by excitation of a photocarrier upon light irradiation to the semiconductor film 435.

The present inventors have developed the TFT 471 which can suppress the photoleakage current Ioff to be much lower than that in the conventional case and can achieve an excellent ON/OFF current ratio based on the following reason obtained as the result of the extensive studies.

Figure 10A:
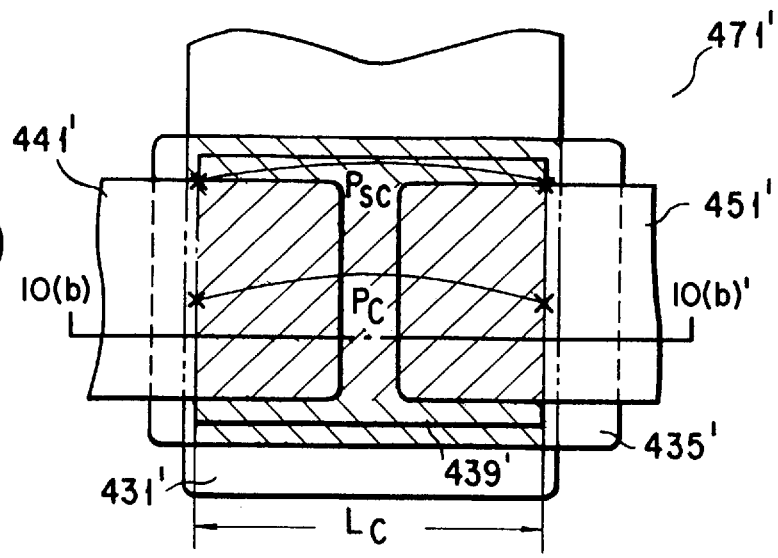
FIGS. 10(a)—10(b) explain a photoleakage current Ioff.

The factor that causes the photoleakage current Ioff in the TFT will be explained. FIG. 10(*a*) shows the schematic planar structure of a general TFT 471', and FIG. 10(*b*) shows the schematic sectional structure of the TFT 471' taken along the line 10(b)—10(b)' of FIG. 10(a). In FIG. 10(a), a channel region is indicated by a hatched (/) portion, and a side-channel region is indicated by a hatched (\) portion. In the TFT 471', a photoleakage current Ioff flows through a path Psc having a length equal to a side-channel length Lsc and existing in the side-channel region rather than through a path Pc having a length equal to a channel length Lc and existing in the channel region.

More specifically, the amount of light incident on the side-channel region is larger than the amount of light incident on the channel region shielded by a gate electrode 431', a source electrode 451', or a drain electrode 441'. This causes a larger photoleakage current Ioff to flow in the side-channel region than in the channel region.

Generally, an electric field having a higher intensity than in the channel region is generated in this side-channel region, depending on the shapes of the source electrode 451' and the drain electrode 441'. This causes an increase in photoleakage current Ioff.

Figure 10B:
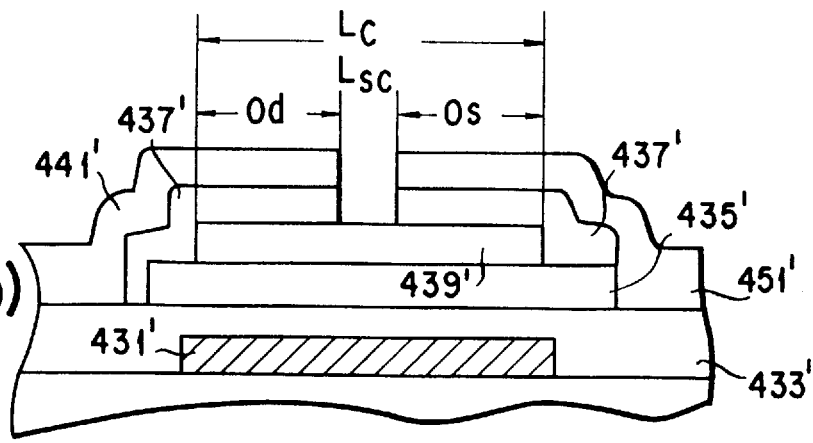

The TFT 471' has a structure in which the source electrode, 451' and the drain electrode 441' are formed on a semiconductor film 435' and a channel protection film 439'. As shown in FIG. 10(b), the source electrode 451' and the drain electrode 441' overlap the channel region only with predetermined overlapping lengths Os and Od along the direction of the channel length Lc. Even if a carrier is generated in the channel region, almost all the carrier disappears in the region shielded by the source electrode 451' and the drain electrode 441', and they do not flow as the photoleakage current Ioff. In contrast to this, since the side-channel region does not overlap the source electrode 451' and the drain electrode 441', the carrier generated in the side-channel region flows as the photoleakage current Ioff.

In the TFT 471' described above, the photoleakage current Ioff tends to be influenced more by the side-channel region than by the channel region.

In contrast to this, in the TFT 471 of this embodiment, the length of the path Psc of the photoleakage current Ioff (i.e., the side-channel length Lsc of the side-channel region shown in FIG. 9(b)) is set larger than the length of the path Pc of the optical leakage current Ioff (i.e., the channel length Lc of the channel region shown in FIG. 9(c)) by the sum of the extending lengths β1 and β2 of the channel protection film 439.. Thus, the photoleakage current Ioff is reduced as a whole.

Furthermore, the TFT 471 has a structure in which the source electrode 451 and the drain electrode 441 are formed on the semiconductor film 435 and the channel protection film 439. As shown in FIG. 9(c), the source electrode 451 and the drain electrode 441 overlap the channel region only with overlapping lengths Os and Od of 3 microns, respectively, along the direction of the channel length Lc. Thus, even if a carrier is generated in the channel region, it is prevented from flowing as a photoleakage current Ioff. In order to completely block the photoleakage current Ioff flowing through the path Pc in the channel region, either the overlapping length Od or Os must be set to be larger than 3 microns by considering the carrier mobility and the like. However, an effect of decreasing the photoleakage current Ioff can be obtained if the overlapping lengths Od and Os satisfy 1 micron$\leq$Od, Os$\leq$3 microns.

According to the TFT 471 of the second embodiment, incidence of undesired oblique light on the semiconductor film 435 is effectively blocked, and the photoleakage current Ioff can be basically reduced by a specific structure that makes it difficult to generate the carrier by excitation with incident light. When this TFT 471 is used in the active matrix type liquid crystal display device 601, the ON/OFF current ratio is increased by 330% when compared to a case wherein the conventional TFT having similar channel length Lc and channel width Wc is used. As a result, with the active matrix type liquid crystal display device 601 of this embodiment, a uniform display image is obtained throughout the entire display screen.

Figure 11:
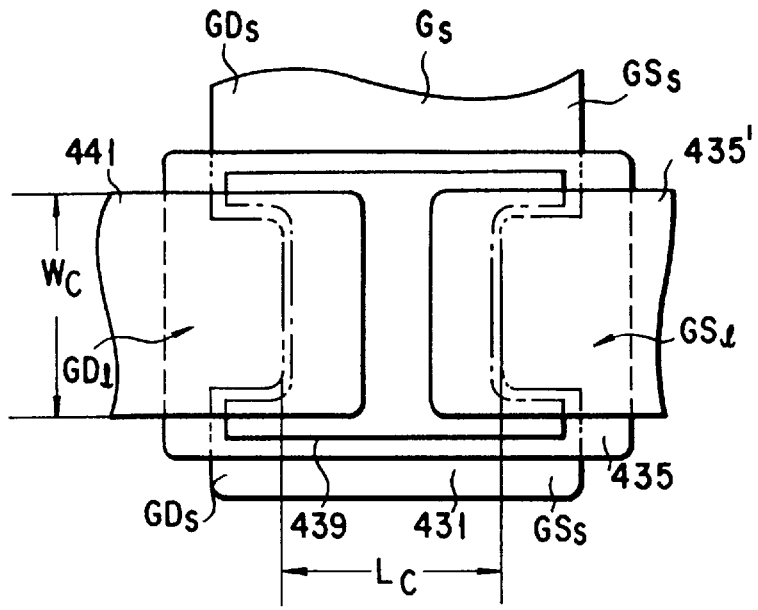
FIG. 11 is a plan view showing a modification of the TFT shown in FIG. 8.

The TFT 471 of this embodiment may be constituted such that the drain- and source-side extension regions GDs and GSs of the gate electrode 431 respectively have notched portions GD9 and GS9, as shown in FIG. 11. This arrangement decreases the gate-source path parasitic capacitance Cgs of the TFT 471. Thus, the potential drop of the pixel electrode 481 which occurs immediately after the TFT 471 is turned off from the ON state can be prevented. Also, the time constants of the gate electrode 431 and the signal line 421 can be decreased. This is effective especially in a large liquid crystal display device having a large wiring length.

When the channel protection film 439 is patterned by rear-surface exposure using the gate electrode 431 as the mask, the outline of the gate electrode 431 and the outline of the channel protection film 439 can be set at substantially the same positions, as shown in FIG. 11. This causes a further decrease in gate-source path parasitic capacitance Cgs and gate-drain path parasitic capacitance Cgd of the TFT 471, and solves mask misalignment (non-uniform shot) which occurs in an exposure process which is performed for each array substrate when a plurality of array substrates are to be formed from a large-sized glass substrate.

Furthermore, in this embodiment, the channel protection film 439 is arranged between the low-resistance semiconductor thin films 437 and the semiconductor film 435 and made by a material different from that of the low-resistance semiconductor thin film 437. When etching is performed to pattern the low-resistance semiconductor thin films 437, this etching can be ended before the semiconductor film 435 is partially removed by utilizing a difference in etching rate between the channel protection film 439 and the low-resistance semiconductor thin films 437. Accordingly, the semiconductor film 435 need not to be formed thick considering the amount removed by etching, and the thickness of the semiconductor film 435 is set to a very small value of 300 Å. Since the semiconductor film 435 is made thin in this manner, the photoleakage current Ioff can be further decreased. The thinner the semiconductor film 435, the more the photoleakage current Ioff can be decreased. However, if it is considered to obtain a sufficient ON current Ion and to suppress variations in film thickness and film characteristics, the thickness of the semiconductor film 435 must fall within a range of 100 Å to 500 Å, and preferably a range of 100 Å to 300 Å.

An active matrix type liquid crystal display device 1101 according to the third embodiment of the present invention will be described with reference to FIGS. 12 and 13.

This liquid crystal display device 1101 has a basic structure which is similar to those of the embodiments described above, and thus most of its repetitive explanation will be omitted. The liquid crystal display device 1101 has an array substrate 901 obtained by forming, on a glass substrate 900, a matrix of a plurality of pixel electrodes 981 and a plurality of TFTs 971 respectively connected to the pixel electrodes 981. The array substrate 901 has scanning lines 911 and signal lines 921 formed along the rows and columns of the plurality of pixel electrodes 981 on the glass substrate 900. The TFTs 971 are arranged in the vicinities of the intersections of the scanning lines 911 and the signal lines 921. In each TFT 971, the gate electrode is constituted by the trunk of the corresponding scanning line 911, a drain electrode 941 is formed integrally with the corresponding signal line 921, and a source electrode 951 is formed in contact with the corresponding pixel electrode 981.

Although not shown, the liquid crystal display device 1101 further has a counter substrate and a liquid crystal layer. A counter electrode made of ITO (Indium Tin Oxide) is formed on a glass substrate, thereby forming the counter substrate. The liquid crystal layer is made of a nematic liquid crystal compound. The array substrate 901 and the counter substrate oppose each other such that alignment films respectively formed on their surface are on their inner sides. The liquid crystal layer is held between the array substrate 401 and the counter substrate. The counter substrate has a grid-like light-shielding layer 1011 formed on the glass substrate. The counter electrode is formed on the light-shielding layer 1011 through an insulating film. The light-shielding layer 1011 is made of chromium (Cr) and shields light leaking from portions around the plurality of pixel electrodes 981 formed on the array substrate 901 side, i.e., from regions where the TFTs 971, the signal lines 921, and the scanning lines 911 are formed.

The active matrix type liquid crystal display device 1101 further has polarizing plates formed on the surfaces of the respective glass substrates on sides opposite to the liquid crystal layer.

Each scanning line 911 is constituted by a multi-layered structure of molybdenum (Mo) and aluminum (Al). As shown in FIGS. 12 and 13(a), a gate region Gs of the scanning line 911 that serves as the gate electrode is formed to have a gate width Lg1 of 14 microns. Each scanning line 911 has a drain-side extension region GDs extending from the gate region Gs toward the drain electrode 941 in the direction of the channel length Lc for an extending length $\alpha 1$ of 6 microns and overlapping the drain electrode 941. The drain-side extension region GDs has, at its region overlapping the drain electrode 941, a gate electrode notched portion GD1 smaller than the drain electrode 941.

The extending length $\alpha 1$ of the drain-side extension region GDs is set to 6 microns so that the scanning line width Lg2 in the vicinity of a region serving as the gate electrode of the TFT 971 is 20 microns. This is due to the following reason. In the same manner as in the embodiments described above, if the scanning line width Lg2 in the vicinity of the region serving as the gate electrode is 20 microns or more, undesired oblique light can be shielded, and a high degree of opening can be set.

Apparently, also in this embodiment, the scanning line width Lg2 in the vicinity of the region serving as the gate electrode may be set to 26 microns, in the same manner as in the embodiments described above. Assume that it is considered to further shut off the undesired oblique light. On the surface of the counter substrate of the active matrix type liquid crystal display device 901 of this embodiment, since light is reflected mainly by the surface of the light-shielding layer 1011, if the distance between the surface of the light-shielding layer 1011 and the surface of the glass substrate 900 on which the scanning lines 911 are formed is defined as d microns, the scanning line width Lg2 of may be set to 3d microns or more, and preferably, 4d microns or more. When the light-shielding layer 1011 is formed on the array substrate 901 side, a layer on the counter substrate side which has the largest light reflectance may be used as the reference.

A gate insulating film 933 (refer to FIG. 14) is constituted by a silicon oxide ($SiO_2$) film formed on the gate region Gs and the source-side extension region GDs to a thickness of 3,500 Å and a silicon nitride ($SiN_x$) film formed on the silicon oxide ($SiO_2$) film to a thickness of 500 Å. A semiconductor film 935 is constituted by an amorphous silicon (a—Si:H) film formed on the gate insulating film 933 to a thickness of 300 Å. A channel protection film 939 is constituted by a silicon nitride ($SiN_x$) film formed on the semiconductor film 935 to a thickness of 2,000 Å.

The channel protection film 939 determines the channel length Lc of the TFT 971. As shown in FIGS. 12 and 13(b), the channel protection film 939 is arranged on the semiconductor film 935 such that the channel length Lc is 12 microns. In a region stacked on the semiconductor film 935, the channel protection film 939 has a shape conforming to the outline of the gate region Gs.

More specifically, the channel protection film 939 has a channel length determination region Is determining the channel length Lc of the TFT 971, and a drain-side extension region IDs extending from the channel length determination region Is in a direction substantially parallel to the channel length Lc for an extending length ($\beta 1$: $\beta 1$ is substantially equal to $\alpha 1$) and partly overlapping the drain electrode 941. The drain-side extension region IDs has, in its region overlapping the drain electrode 941, a notched portion ID1 smaller than the drain electrode 941.

The drain electrode 941, integrally formed with the signal line 921 electrically connected to the semiconductor film 935, and the source electrode 951, electrically connected to the pixel electrode 981, are apart from each other. Low-resistance semiconductor thin films 937 (refer to FIG. 14) are provided between the semiconductor film 935 and the drain electrode 941, and between the semiconductor film 935 and the source electrode 951 to achieve good ohmic contact. Each low-resistance semiconductor thin film 937 is constituted by an $n^+$-type amorphous silicon ($n^+a$—Si:H) film formed to a thickness of 500 Å.

As described above, in the TFT 971 of this embodiment, since the effective gate width Lg2 is equal to the sum of the gate width Lg1 of the gate region Gs and the extending length $\alpha 1$, undesired oblique light incident on the TFT 971 can be decreased more than in a TFT having no drain-side extension region IDs by an increase of 60%.

Due to the specific structure of the channel protection film 939, the side-channel length Lsc of the TFT 971 is set to be larger than the channel length Lc of the TFT 971 by the extending length p1 of the drain-side extension region IDs of the channel protection film 939. Thus, the path Psc in the side-channel region that largely influences the optical leakage current Ioff can be set large. Furthermore, since the source electrode 951 and the drain electrode 941 are formed on the channel protection film 939 to have an overlapping length of 3 $\mu$m, even if carriers are generated in the channel region, they do not form a photoleakage current Ioff.

From the above reason, in the active matrix type liquid crystal display device 901 of this embodiment, when compared to an active matrix type liquid crystal display device using a TFT in which the scanning line 911 does not have a drain-side extension region GDs or notched portion GD9 and the channel protection film 939 does not have a drain-side extension region IDs or notched portion ID1, the photoleakage current Ioff of the TFT 971 can be sufficiently decreased. Furthermore, in this liquid crystal display device 901, the ON/OFF current ratio of the TFT 971 can be increased by 150% due to its specific structure as well.

Since the notched portion GD1 is formed in the drain-side extension region GDs of the scanning line 911, the time constant of the scanning line 911 is decreased. This prevents distortion in waveform of the gate pulse and enables to sufficiently prolong the ON period of the TFT 971. Accordingly, a higher-quality display image can be obtained.

Figure 12:
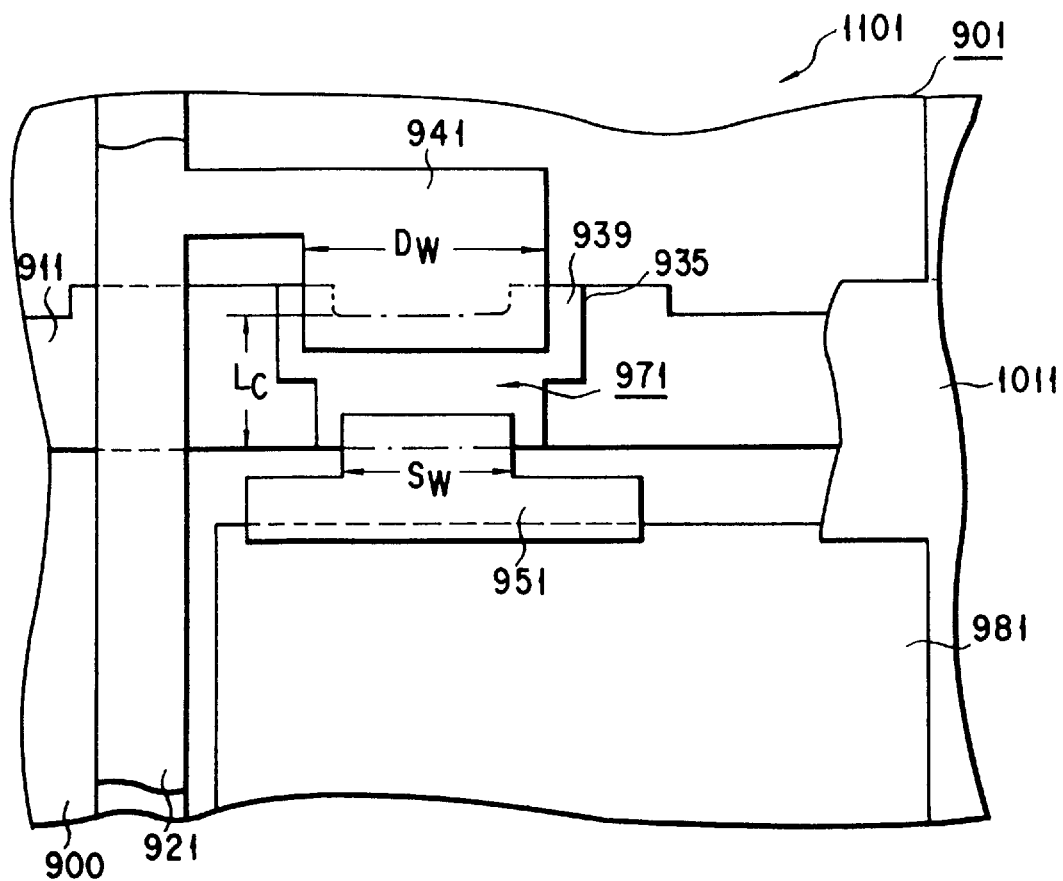
FIG. 12 is a plan view schematically showing the structure of a part of an active matrix type liquid crystal display device according to the third embodiment of the present invention.
Figure 13A:
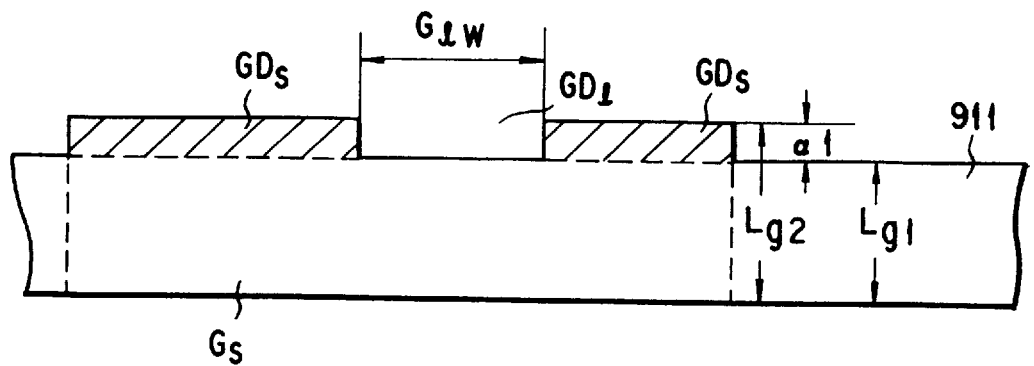
FIGS. 13(a)–13(b) explain a TFT shown in FIG. 12.
Figure 13B:
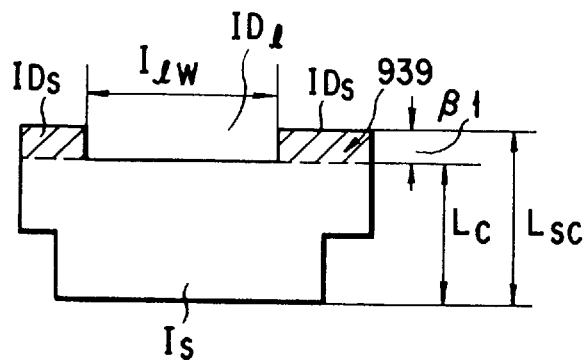

Furthermore, in this embodiment, as shown in FIG. 12, the source electrode 951 is formed such that its electrode width Sw is substantially equal to widths Glw and Ilw of the notched portion GDs of the scanning lines 911 and the notched portion IDs of the channel protection film 939, respectively, in a direction substantially perpendicular to the channel length Lc, and the drain electrode 941 is formed to have an electrode width Dw larger than the electrode width Sw of the source electrode 951. Even when notched portions GDs and IDs are formed in the scanning line 911 and the channel protection film 939, respectively, the ON current Ion is not decreased.

A method of manufacturing the active matrix type liquid crystal display device 1101 according to the third embodiment will be described with reference to FIG. 14.

Figure 14A:
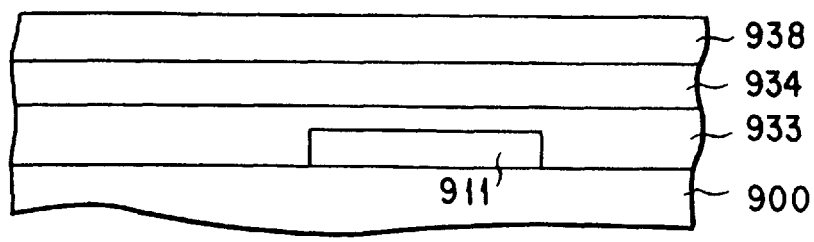
FIGS. 14(a)–14(f) include views showing the manufacturing steps of the active matrix type liquid crystal display device shown in FIG. 12.

First, as shown in FIG. 14(a), an Mo—Ta alloy is formed on a glass substrate 900 by deposition to a thickness of 3,000 Å and patterned, thereby forming a plurality of scanning lines 911. Although not shown, simultaneously with formation of the scanning lines 911, storage capacitor lines are formed to be arranged substantially parallel to the scanning lines 911.

Each scanning line 911 is formed to have a wiring width of 14 microns, and its gate region Gs is patterned to have a 6-micron drain-side extension region GDs having a notched portion GDl, as shown in FIG. 13(a).

A silicon oxide ($SiO_2$) film and a silicon nitride ($SiN_x$) film are formed by deposition on the scanning line 911 to a thickness of 3,000 Å and 500 Å, respectively, to form a gate insulating film 933. Then, an amorphous silicon (A—Si:H) film 934 having a thickness of 300 Å and a silicon nitride ($SiN_x$) film 938 having a thickness of 2,000 Å are continuously formed in accordance with CVD.

Figure 14B:
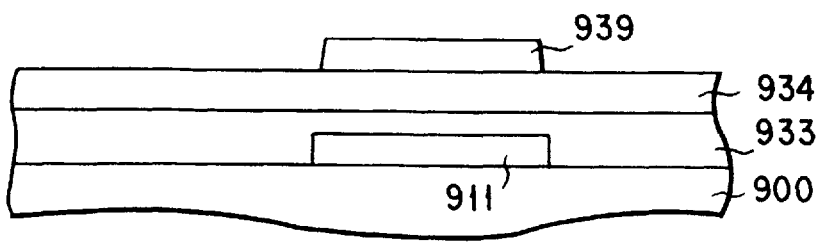

Thereafter, a resist is coated on the silicon nitride ($SiN_x$) film 938. The obtained structure is exposed from the rear surface by using the scanning line 911 as the mask and patterned. As a result, a channel protection film 939 self-aligned with the scanning line 911 and having a drain-side extension region IDs and a notched portion IDl is obtained, as shown in FIGS. 14(b) and 13(a).

Figure 14C:
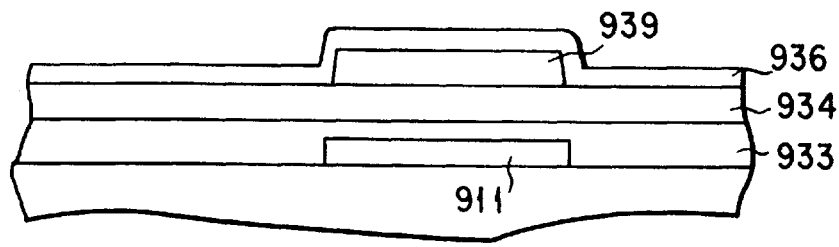

As shown in FIG. 14(c), an $n^+a$—Si:H film 936 having a thickness of 500 Å is formed on the channel protection film 939 by deposition in accordance with CVD.

Figure 14D:
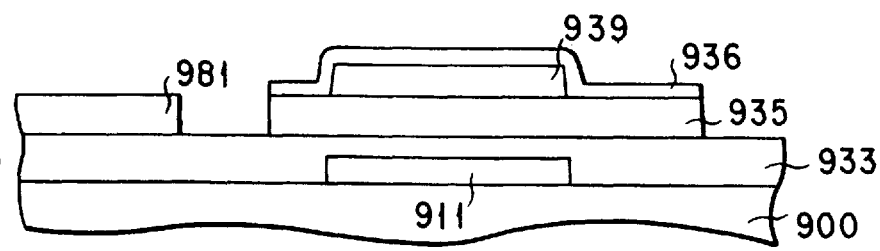

Then, as shown in FIG. 14(d), the amorphous silicon film 934 and $n^+a$—Si:H film 936 excluding regions under a signal line 921 and the channel protection film 939 are removed to form a semiconductor film 935 and an island of the $n^+a$—Si:H film 936. An ITO film is formed on the obtained structure by deposition and patterned to have a predetermined shape, thereby forming a pixel electrode 981.

Figure 14E:
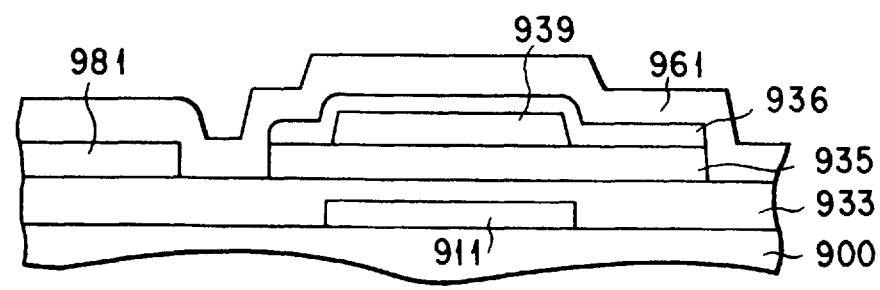

As shown in FIG. 14(e), molybdenum (Mo) and aluminum (Al) are formed by deposition to a thickness of 500 Å and 3,000 Å, respectively, thereby forming a multilayered film 961 as a prospective region of the signal line 921 (see to FIG. 12), a source electrode 951, and a drain electrode 941.

Figure 14F:
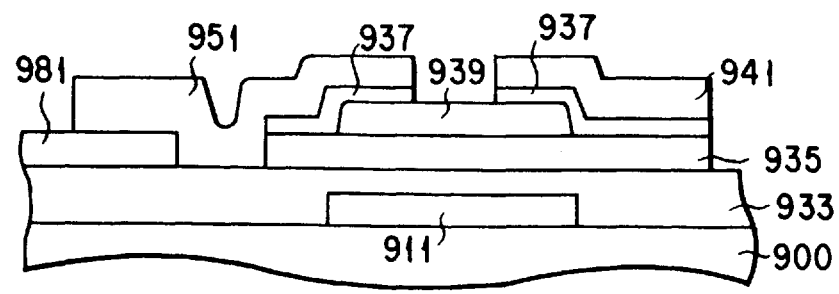

As shown in FIG. 14(f), the island of the $n^+a$—Si:H film 936 and the multilayered film 961 are patterned to form low-resistance semiconductor thin films 937, the source electrode 951, the drain electrode 941, and the signal line 921 (see to FIG. 12) integral with the drain electrode 941.

Thereafter, a protection film and alignment films (not shown) are sequentially formed in accordance with a normal method, thereby obtaining an array substrate. The counter substrate and the array substrate are set to oppose each other through a spacer such that the distance between the glass-substrates is 5.1 microns. The portion around the two opposing substrates is sealed with a sealing agent excluding a liquid crystal injection-hole. Then, a liquid crystal composition is injected into the resultant structure from the liquid crystal injection hole, and the liquid crystal injection hole is sealed.

Polarizing plates are arranged at appropriate portions, thereby completing an active matrix type liquid crystal display device 901 of this embodiment.

When the active matrix type liquid crystal display device 901 is formed in the above manner, since the channel protection film 939 is formed to be self-aligned with the scanning line 911, a gate-source path parasitic capacitance Cgs and a source-drain path parasitic capacitance Cgd of the TFT 971 will not be increased. Since the channel protection film 939 protects the semiconductor film 935 during patterning of the $n^+a$—Si:H film 936, the semiconductor film 935 can be formed to be sufficiently thin, thereby decreasing the photoleakage current Ioff.

In the embodiments described above, low-resistance semiconductor films are interposed between a semiconductor film and electrodes to achieve ohmic contact between them. However, a process, e.g., ion implantation may be executed by using the channel protection film as a mask, and low-resistance semiconductor film regions may be formed in the semiconductor film.

In any of the embodiments described above, an amorphous silicon (a—Si:H) film is used as the semiconductor film. However, a poly silicon (p—Si) film, a compound semiconductor film, e.g., a Cd—Se film, or the like may be used as the semiconductor film, as a matter of course.

In the embodiments described above, the liquid crystal layer is made of a nematic liquid crystal composition. Other than this, a polymer-dispersed liquid crystal (PD-LC) made of a mixture of a polymeric resin and a liquid crystal material may be used as the material of the liquid crystal layer, as a matter of course. In particular, in an active matrix type liquid crystal display device using a polymer-dispersed liquid crystal (PD-LC), since light which is scattered in the liquid crystal layer and is incident on the TFT is present, the photoleakage current Ioff is increased. According to the present invention, however, even in this active matrix type liquid crystal display device, the photoleakage current Ioff can be sufficiently decreased, thereby obtaining a high-quality display image.

Industrial Applicability

According to the present invention, the photo-leakage current Ioff of a thin-film transistor can be sufficiently suppressed, thereby achieving a high ON/OFF current ratio.

In an active matrix type liquid crystal display device formed by using such a TFT, a high-quality display image can be obtained.

We claim:

1. A thin-film transistor comprising:

an insulating substrate;

a light-shielding gate electrode positioned on said insulating substrate;

a gate insulating film positioned on said gate electrode;

a semiconductor film positioned above said gate electrode through said gate insulating film;

a light-shielding source electrode; and a light-shielding drain electrode, said source electrode and drain electrode electrically contacting said semiconductor film at respective electrical contacts, a channel being defined in said semiconductor film between said respective electrical contacts, said channel being positioned above said gate electrode, a length of said channel being less than a width of said gate electrode;

wherein said gate electrode has wide parts located at areas corresponding to sides of said channel and extending toward at least one of said source and drain electrodes to reduce light that is applied to said one side of said channel without being shielded by said source and drain electrodes.

2. A thin-film transistor according to claim 1, wherein said semiconductor film is a silicon semiconductor film.

3. A thin-film transistor according to claim 2, wherein said silicon semiconductor film has a thickness of not less than 100 Å and not more than 500 Å.

4. A thin-film transistor according to claim 1, further comprising a channel protection film formed on said semiconductor film to separate said respective electrical contacts.

5. A thin-film transistor according to claim 4, wherein said channel protection film is disposed over an inside area of said gate electrode below said source electrode and said drain electrode.

6. A thin-film transistor according to claim 5, wherein said channel protection film is self-aligned with said gate electrode in a width direction of said gate electrode.

7. A thin-film transistor according to claim 1, wherein each wide part of said gate electrode has an overlap portion which overlaps said drain electrode.

8. A display device comprising:

a first substrate having scanning and signal lines, a pixel electrode and a thin-film transistor for driving said pixel electrode, said thin-film transistor comprising:
  a light-shielding gate electrode positioned on said first substrate and connected to said scanning line;
  a gate insulating film positioned on said gate electrode;
  a semiconductor film positioned above said gate electrode through said gate insulating film;
  a light-shielding source electrode;
  a light-shielding drain electrode, said source electrode and said drain electrode electrically connecting said semiconductor film at respective electrical contacts, a channel being defined in said semiconductor film between said respective electrical contacts, said channel being positioned above said gate electrode, a length of said channel being less than a width of said gate electrode;

a second substrate positioned to oppose said first substrate; and an optical modulating layer positioned between said first and second substrates;

wherein said gate electrode has wide parts located at areas corresponding to sides of said channel and extending toward at least one of said source and drain electrode to reduce light that is applied to said one side of said channel without being shielded by said source and drain electrodes.

9. A thin-film transistor comprising:

an insulating substrate;

a light-shielding gate electrode positioned on said insulating substrate;

a gate insulating film positioned on said gate electrode;

a semiconductor film positioned above said gate electrode through said gate insulating film;

a light-shielding source electrode;

a light-shielding drain electrode, said source electrode and said drain electrode electrically connecting said semiconductor film at respective electrical contacts, a channel being defined in said semiconductor film between said respective electrical contacts, said channel being positioned above said gate electrode, a length of said channel being less than a width of said gate electrode; and a channel protection film formed on said semiconductor film separating said respective electrical contacts by at least said channel length;

wherein said channel protection film has wide parts located at areas corresponding to sides of said channel and extending toward at least one of said source and drain electrodes to lengthen current paths for photo carriers generated in said semiconductor film upon incidence of light which is not shielded by said gate, source, drain electrodes, a width of said wide part not exceeding said width of said gate electrode.

10. A thin-film transistor according to claim 9, wherein at least one of said source electrode and said drain electrode overlaps said channel protection film by a length of not less than 1 micron.

11. A thin-film transistor according to claim 9, wherein at least one of said source electrode and said drain electrode overlaps said channel protection film by a length of not less than 3 microns.

12. A thin-film transistor according to claim 9, wherein said channel protection film is self-aligned with said gate electrode in a width direction of said gate electrode.

13. A thin-film transistor according to claim 9, wherein said semiconductor film has a thickness of not less than 100 Å and not more than 500 Å.

14. A display device comprising:

a first substrate having a scanning and signal lines, a pixel electrode and a thin-film transistor for driving said pixel electrode, said thin-film transistor comprising:
  a light-shielding gate electrode positioned on said first insulating substrate and connected to said scanning line;
  a gate insulating film positioned on said gate electrode;
  a semiconductor film positioned above said gate electrode through said gate insulating film;
  a light-shielding source electrode;
  a light-shielding drain electrode, said source electrode and said drain electrode electrically connecting said semiconductor film at respective electrical contacts, a channel being defined in said semiconductor film between said respective electrical contacts, said channel being positioned above said gate electrode, a length of said channel being less than a width of said gate electrode; and
  a channel protection film formed on said semiconductor film separating said respective electrical contacts by at least said channel length;

a second substrate positioned to oppose said first substrate; and an optical modulating layer positioned between said first and second substrates;

wherein said channel protection film has wide parts located at areas corresponding to sides of said channel and extending toward at least one of said source and drain electrodes to lengthen current paths for photo carriers generated in said semiconductor film upon incidence of light which is not shielded by said gate, source, drain electrodes, a width of said wide part not exceeding said width of said gate electrode.

15. A thin-film transistor comprising:

an insulating substrate;

a gate electrode positioned on said insulating substrate;

a gate insulating film positioned on said gate electrode;

a semiconductor film positioned above said gate electrode through said gate insulating film; and source and drain electrodes arranged in a width direction of said gate electrode and electrically contacting said semiconductor film at respective electrical contacts to define a channel between respective contacts;

wherein said gate electrode has a first width in a first area set between sides of said source electrode and between sides of said drain electrode and a second width greater than said first width in a second area set outside the first area in a length direction of said gate electrode.

16. A thin-film transistor according to claim 15, wherein said semiconductor film is a silicon semiconductor film having a thickness of not less than 100 Å and not more than 500 Å.

17. A thin-film transistor comprising:

an insulating substrate;

a gate electrode positioned on said insulating substrate;

a gate insulating film positioned on said gate electrode;

a semiconductor film positioned above said gate electrode through said gate insulating film; and source and rain electrodes arranged in a width direction of said gate electrode and electrically contacting said semiconductor film at respective electrical contacts to define a channel of a predetermined channel length between said respective contacts;

wherein said gate electrode comprises a gate region having a gate length greater than said channel length in a direction substantially parallel to a length direction of said channel, and an extension region extending from said gate region in a direction substantially parallel to said width direction of said gate electrode and partly overlapping at least one of said source and drain electrodes.

* * * * *